United States Patent [19]

Sakai et al.

[11] Patent Number: 4,501,808

[45] Date of Patent: Feb. 26, 1985

[54] RECORDING MEDIUM AND PROCESS EMPLOYING A PHOTOSENSITIVE ORGANIC FILM

[75] Inventors: Kiyoshi Sakai, Mitaka; Shozo Ishikawa, Yokohama; Tetsuo Arita, Shiki; Minoru Mabuchi; Shoji Umehara, both of Tokyo, all of Japan

[73] Assignee: Canon Kabushiki Kaisha, Tokyo, Japan

[21] Appl. No.: 526,533

[22] Filed: Aug. 25, 1983

[30] Foreign Application Priority Data

Aug. 30, 1982 [JP] Japan ................................. 57-150514
Aug. 30, 1982 [JP] Japan ................................. 57-150515
Aug. 30, 1982 [JP] Japan ................................. 57-150516
Nov. 5, 1982 [JP] Japan ................................. 57-194349
Nov. 5, 1982 [JP] Japan ................................. 57-194350

[51] Int. Cl.³ .............................................. G03G 5/09
[52] U.S. Cl. ........................................... 430/59; 430/60; 430/72; 430/78; 430/87; 430/94; 430/945
[58] Field of Search ............... 430/66, 72, 73, 74, 430/75, 83, 59, 60, 78, 87

[56] References Cited

U.S. PATENT DOCUMENTS

| | | | |
|---|---|---|---|
| 3,938,994 | 2/1976 | Reynolds et al. | 430/83 |
| 3,973,962 | 8/1976 | Contois et al. | 430/75 |
| 3,997,342 | 12/1976 | Bailey | 430/59 |
| 4,233,443 | 11/1980 | Petropoulos et al. | 430/72 |
| 4,281,053 | 7/1981 | Tano | 430/66 |

*Primary Examiner*—John E. Kittle
*Assistant Examiner*—John L. Goodrow
*Attorney, Agent, or Firm*—Fitzpatrick, Cella, Harper & Scinto

[57] ABSTRACT

An organic film comprising at least one compound of the following formulae (1)–(5):

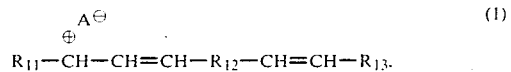

wherein $R_{11}$ and $R_{13}$ each represent substituted or unsubstituted aryl, $R_{12}$ represents substituted or unsubstituted arylene, and $A^{\ominus}$ represents an anionic residue;

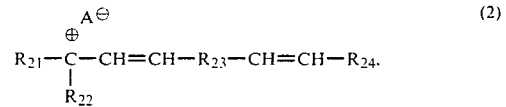

wherein $R_{21}$, $R_{22}$, and $R_{24}$ each represent substituted or unsubstituted aryl, $R_{23}$ represents substituted or unsubstituted arylene, and $A^{\ominus}$ represents an anionic residue;

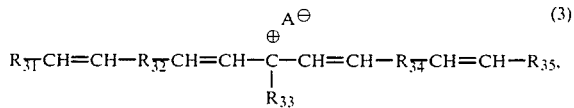

wherein $R_{31}$, $R_{33}$, and $R_{35}$ each represent substituted or unsubstituted aryl, $R_{32}$ and $R_{34}$ each represent substituted or unsubstituted arylene, and $A^{\ominus}$ represents an anionic residue;

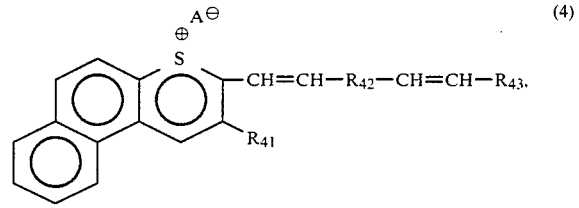

wherein $R_{41}$ represents alkyl, substituted or unsubstituted phenyl, or substituted or unsubstituted styryl, $R_{42}$ represents substituted or unsubstituted arylene, $R_{43}$ represents substituted or unsubstituted aryl, and $A^{\ominus}$ represents an anionic residue; and (Abstract continued on next page.)

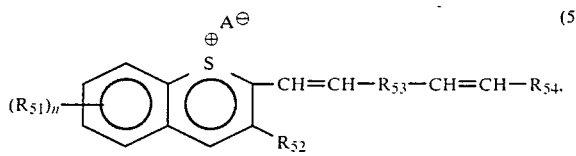
(5)
wherein $R_{51}$ represents alkoxy, $R_{52}$ represents alkyl, $R_{53}$ represents substituted or unsubstituted arylene, $R_{54}$ represents substituted or unsubstituted aryl, $A^{\ominus}$ represents an anionic residue, and n represents an integer of 1 or 2.
56 Claims, 3 Drawing Figures

RECORDING MEDIUM AND PROCESS EMPLOYING A PHOTOSENSITIVE ORGANIC FILM

BACKGROUND OF THE INVENTION

1. Field of the Invention

This invention relates to an organic film capable of absorbing effectively laser beams, especially semiconductor laser beams of longer wavelengths, and converting the absorbed energy into another kind of energy. More particularly, this invention relates to a novel organic film utilizable as: a photosensitive film in the electrophotographic printing system wherein a semiconductor laser is used as light source; an optical disk recording layer where information can be written in and reproduced from by means of semiconductor laser beams; or an infrared cutting filter.

2. Description of the Prior Art

The electrophotographic printing system wherein a semiconductor laser is used as light source can record desired image information for later reproduction, by modulating the laser with electric signals in response to the image information, and scanning the surface of a photosensitive member with the modulated laser beam by use of a galvano-mirror or the like to form an electrostatic latent image on the photosensitive member, followed by the development with a toner and the successive transfer of the toner image. Lasers for use in this system are generally gas lasers including a helium-cadmium laser (wavelength 441.6 nm) and a helium-neon laser (wavelength 632.8 nm). Accordingly, photosensitive members spectral-sensitized up to a wavelength of 650 nm are adaptable to such light sources. For example, the following types of photosensitive member are known as suitable ones: a type having a photosensitive layer containing a charge-transfer complex of polyvinylcarbazole with trinitrofluorenone; a type provided with a vapor-deposited layer of tellurium sensitized with selenium; a type having two layers, one being a selenium layer vapor-deposited as a charge transport layer on a conductive layer and the other being a selenium-tellurium layer vapor-deposited on the selenium layer; a type having a photosensitive layer of cadmium sulfide spectral-sensitized with sensitizing dye; a type having two separately functioning photosensitive layers of an organic-pigment-containing charge generation layer and a charge transport layer, both spectral-sensitized to longer wavelengths.

On the other hand, the recording film used for the optical disk technique can store high density information in the form of spiral or circular tracks of minute pits (e.g. about 1 μmφ) optically detectable. For writing information on such a disk, the surface of its laser-responsive layer is scanned with a converged laser beam, modulated according to the information, thereby forming pits at the positions irradiated with the laser pulses. These pits form a spiral track or circular tracks. The laser-responsive layer can form optically detectable pits by absorption of laser energy. For instance, in a heat mode recording system, the laser-responsive layer absorbs laser energy at the irradiated positions, where minute depressions (pits) are formed through evaporation or fusion by being heated with the absorbed energy. In another heat mode recording system, pits having optically detectable differences in density can be formed with the laser energy absorbed at the irradiated positions.

The information stored in the optical disk can be read by tracing said tracks with a laser beam and detecting an optical difference between the pit and pit-free positions. For instance, the energy of the track-tracing laser beam reflected from the disk is monitored with a photodetector. When the laser beam hits the pit-free position, the output of the photodetector drops. On the contrary, when hitting the pit, the laser beam is sufficiently reflected from an underlying reflecting surface, raising the output of the photodetector.

Recording media hitherto proposed to be used for such an optical disk are principally inorganic materials such as thin metallic film, e.g. vapor-deposited aluminum films and thin films of bismuth, tellurium oxide, and chalcogenite family amorphous glass.

Meanwhile, small-sized and low-cost semiconductor lasers have been developed in recent years. Most of these lasers emit a ray having a wavelength of 750 nm or longer. For recording and/or reproducing information by use of such a semiconductor laser, the laser-responsive film needs to have an absorption maximum in a longer wavelength region (generally from 750 to 850 nm).

However, the existing laser-responsive films, because of the high reflections of laser beams therefrom, have disadvantages in that the utilization efficiency for laser energy is low and a high sensitivity is hence not attainable. Additional disadvantages of these films are that a complicated layer structure is necessary for shifting the spectral sensitivity to a wavelength of 750 nm or longer, and particularly in the case of electrophotographic photosensitive films, the sensitizing dye used will fade out during repeated charging and exposing operations.

Such being the case, there have been proposed organic films highly sensitive to rays of wavelengths of 750 nm and longer. For example, organic films containing the pyrylium dye disclosed in U.S. Pat. No. 4,315,983 or in "Research Disclosure", 20517 (May 1981) and those containing the squarylium dye disclosed in "J. Vac. Sce. Technol." 18(1), pp 105–109, (January/February 1981) are known to be responsive to lasers of wavelengths of 750 nm and longer.

However, no organic film satisfactory in practical use has yet been developed on account of the following difficulties involved: The stability of organic compounds, as a rule, becomes worse with increasing wavelength of the light that they can absorb; that is to say, organic compounds capable of absorbing rays of very long wavelengths are generally liable to be decomposed with a slight temperature rise; The organic film to be used for the electrophotographic printing system or for the optical disk is required at the same time to fulfill various requirements on the performance characteristics.

SUMMARY OF THE INVENTION

Figure 1:
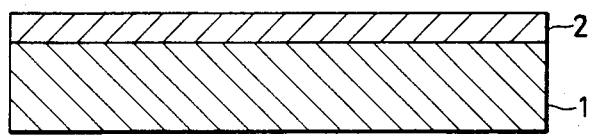
FIGS. 1 and 2 are cross-sectional views of optical disks having the organic film of this invention.

An object of this invention is to provide a novel and useful organic film.

Another object of this invention is to provide an organic film having an absorption band in a region of longer wavelength, particularly at a wavelength of 750 nm or longer.

Another object of this invention is to provide an organic film stable to heat and sublimation.

Another object of this invention is to provide an electrophotographic photosensitive film for use in the electrophotographic printing system wherein a laser is utilized as light source.

Another object of this invention is to provide an electrophotographic photosensitive film having a high sensitivity to rays of wavelengths 750 nm or longer.

Another object of this invention is to provide an optical-disk recording film.

Another object of this invention is to provide an optical-disk recording film having a high sensitivity to rays of wavelengths 750 nm or longer and a sufficiently high S/N ratio.

These objects and others are achieved with an organic film comprising at least one compound of the following general formula (1)–(5):

General formula (1)

$$R_{11}-\overset{\overset{A^{\ominus}}{\oplus}}{CH}-CH=CH-R_{12}-CH=CH-R_{13}$$

In the formula, $R_{11}$ and $R_{13}$ each represent substituted or unsubstituted aryl, $R_{12}$ represents substituted or unsubstituted arylene, and $A^{\ominus}$ represents an anionic residue.

General formula (2)

$$R_{21}-\overset{\overset{A^{\ominus}}{\oplus}}{\underset{R_{22}}{C}}-CH=CH-R_{23}-CH=CH-R_{24}$$

In the formula, $R_{21}$, $R_{22}$, and $R_{24}$ each represent substituted or unsubstituted aryl, $R_{23}$ represents substituted or unsubstituted arylene, and $A^{\ominus}$ represents an anionic residue.

General formula (3)

$$R_{31}-CH=CH-R_{32}-CH=CH-\overset{\overset{A^{\ominus}}{\oplus}}{\underset{R_{33}}{C}}-CH=CH-R_{34}-CH=CH-R_{35}$$

In the formula, $R_{31}$, $R_{33}$, and $R_{35}$ each represent substituted or unsubstituted aryl, $R_{32}$ and $R_{34}$ each represent substituted or unsubstituted arylene, and $A^{\ominus}$ represents an anionic residue.

General formula (4)

[Chemical structure: naphtho[2,1-b]thiophene with $A^{\ominus}$ and $\oplus$ on S, bearing —CH=CH—$R_{42}$—CH=CH—$R_{43}$ and $R_{41}$ substituents]

In the formula; $R_{41}$ represents alkyl, substituted or unsubstituted phenyl, or substituted or unsubstituted styryl; $R_{42}$ represents substituted or unsubstituted arylene; $R_{43}$ represents substituted or unsubstituted aryl; and $A^{\ominus}$ represent an anionic residue.

General formula (5)

[Chemical structure: naphthothiophene bearing $(R_{51})_n$, $R_{52}$, and —CH=CH—$R_{53}$—CH=CH—$R_{54}$ with $A^{\ominus}$ on S]

In the formula; $R_{51}$ represents alkoxy; $R_{52}$ represents alkyl; $R_{53}$ represents substituted or unsubstituted arylene; $R_{54}$ represents substituted or unsubstituted aryl; $A^{\ominus}$ represents an anionic residue; and n represents an integer of 1 or 2.

DETAILED DESCRIPTION OF EMBODIMENTS OF THE INVENTION

The organic film of this invention can be formed from a compound represented by the following general formula (1)–(5) by coating methods using a binder therewith or by vapor deposition methods.

General formula (1)

$$R_{11}-\overset{\oplus}{\underset{A^{\ominus}}{CH}}-CH=CH-R_{12}-CH=CH-R_{13}$$

In the formula, $R_{11}$ and $R_{13}$ are the same or different and each represents substituted or unsubstituted aryl such as phenyl or naphthyl. Substituents that $R_{11}$ and $R_{13}$ may have are; for example, substituted amino radicals such as dimethylamino, diethylamino, dipropylamino, dibutylamino, diphenylamino, phenylbenzylamino, and phenylethylamino; cyclic amino radicals such as morpholino, piperidino, and pyrrolidinyl; and alkoxy radicals such as methoxy, ethoxy, and butoxy. $R_{12}$ represents substituted or unsubstituted arylene such as p-phenylene or 1,4-naphthylene which, together with the two neighboring —CH=CH— groups, forms a conjugated double bond system. Substituents that $R_{12}$ may have are; for example, halogen atoms such as chlorine, bromine, and iodine; alkyl groups such as methyl and ethyl; and alkoxy groups such as methoxy and ethoxy.

General formula (2)

$$R_{21}-\overset{\overset{A^{\ominus}}{\oplus}}{\underset{R_{22}}{C}}-CH=CH-R_{23}-CH=CH-R_{24}$$

In the formula, $R_{21}$, $R_{22}$, and $R_{24}$ are the same or different and each represents substituted or unsubstituted aryl such as phenyl or naphthyl. Substituents that $R_{21}$, $R_{22}$, and $R_{24}$ may have are; for example, substituted amino groups such as dimethylamino, diethylamino, dipropylamino, dibutylamino, diphenylamino, phenylbenzylamino, and phenylethylamino; cyclic amino groups such as morpholino, piperidino, and pyrrolidinyl, and alkoxy groups such as methoxy, ethoxy, and butoxy. $R_{23}$ represents substituted or unsubstituted arylene such as p-phenylene or 1,4-naphthylene which, together with the two neighboring —CH=CH— groups, forms a conjugated double bond system. Substituents that $R_{23}$ may have are; for example, halogen atoms such as chlorine, bromine, and iodine; alkyl groups such as methyl and ethyl; and alkoxy groups such as methoxy and ethoxy.

General formula (3)

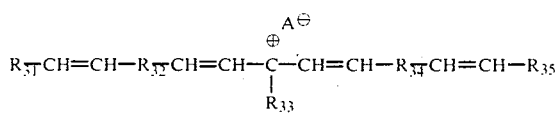

In the formula, $R_{31}$, $R_{33}$, and $R_{35}$ are the same or different and each represents substituted or unsubstituted aryl such as phenyl or naphthyl. Substituents that $R_{31}$, $R_{33}$, and $R_{35}$ may have are, for example, substituted amino group such as dimethylamino, diethylamino, dipropylamino, dibutylamino, diphenylamino, phenylbenzylamino, and phenylethylamino; cyclic amino groups such as morpholino, piperidino, and pyrrolidinyl; and alkoxy groups such as methoxy, ethoxy, and butoxy. $R_{32}$ and $R_{34}$ each represent substituted or unsubstituted arylene such as p-phenylene or 1,4-naphthylene which, together with the two neighboring —CH=CH— groups, forms a conjugated double bond system. Substituents that $R_{32}$ and $R_{34}$ may have are; for example, halogen atoms such as chlorine, bromine, and iodine; alkyl groups such as methyl and ethyl; and alkoxy groups such as methoxy and ethoxy.

General formula (4)

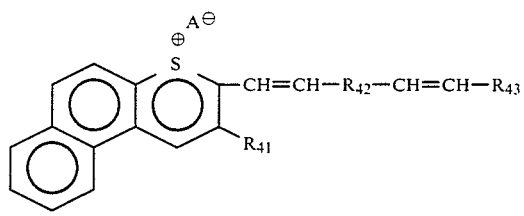

In the formula, $R_{41}$ represents alkyl such as methyl, ethyl, propyl, isopropyl, butyl, or hexyl; substituted or unsubstituted phenyl; or substituted or unsubstituted styryl. Substituents of the phenyl and styryl are; for example, alkoxy groups such as methoxy, ethoxy, and butoxy; halogen atoms such as chlorine, bromine, and iodine; alkyl groups such as methyl, ethyl, propyl, and isopropyl; and nitro group. $R_{42}$ represents substituted or unsubstituted arylene such as p-phenylene or 1,4-naphthylene which, together with the two neighboring —CH=CH— groups, forms a conjugated double bond system. Substituents that $R_{42}$ may have are; for example, halogen atoms such as chlorine, bromine, and iodine; alkyl groups such as methyl and ethyl; and alkoxy groups such as methoxy and ethoxy. $R_{43}$ represents substituted or unsubstituted aryl such as phenyl or naphthyl. Substituents that $R_{43}$ may have are; for example, substituted amino groups such as dimethylamino, diethylamino, dipropylamino, dibutylamino, diphenylamino, phenylbenzylamino, phenylmethylamino, and phenylethylamino; cyclic amino groups such as morpholino, piperidino, and pyrrolidinyl; and alkoxy groups such as methoxy, ethoxy, and butoxy.

General formula (5)

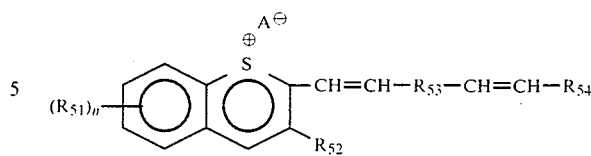

In the formula, $R_{51}$ represents alkoxy such as methoxy, ethoxy, or butoxy. $R_{52}$ represents alkyl such as methyl, ethyl, propyl, or butyl. $R_{53}$ represents substituted or unsubstituted arylene such as p-phenylene or 1,4-naphthylene which, together with the two neighboring —CH=CH— groups, forms a conjugated double bond system. Substituents that $R_{53}$ may have are; for example, halogen atoms such as chlorine, bromine, and iodine; alkyl groups such as methyl and ethyl; and alkoxy groups such as methoxy and ethoxy. $R_{54}$ represents substituted or unsubstituted aryl such as phenyl or naphthyl. Substituents that $R_{54}$ may have are; for example, substituted amino groups such as dimethylamino, diethylamino, dipropylamino, dibutylamino, diphenylamino, phenylbenzylamino, and phenylethylamino; cyclic amino groups such as morpholino, piperidino, and pyrrolidinyl; and alkoxy groups such as methoxy, ethoxy, and butoxy.

$A^{\ominus}$ in the general formulae (1) to (5) represents an anionic residue, for example, $BF_4^{\ominus}$, $ClO_4^{\ominus}$, $CF_3COO^{\ominus}$, $PF_6^{\ominus}$, $Cl^{\ominus}$, $Br^{\ominus}$, $I^{\ominus}$, $ClSO_3^{\ominus}$, $C_2H_5SO_3^{\ominus}$, $C_3H_7SO_3^{\ominus}$, $CH_3SO_3^{\ominus}$, $C_4H_9SO_3^{\ominus}$, $C_5H_{11}SO_3^{\ominus}$, $C_6H_{13}SO_3^{\ominus}$, $CH_3CHClSO_3^{\ominus}$, $ClCH_2CH_2SO_3^{\ominus}$,

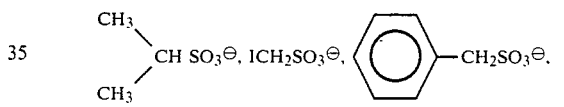

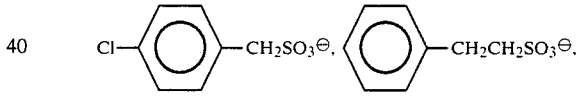

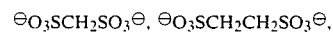

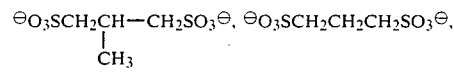

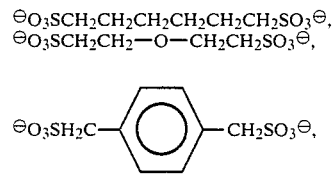

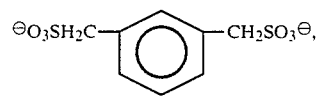

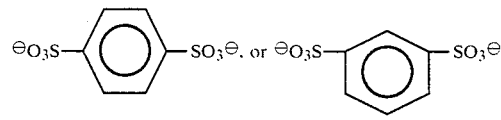

Typical examples of the compound represented by the general formulae (1)–(5) are listed below:

Compounds of the general formula (1)

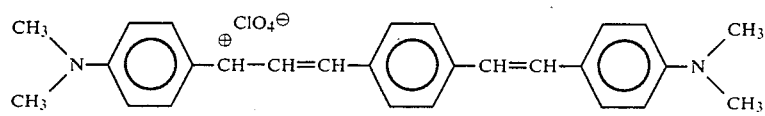 A-(1)
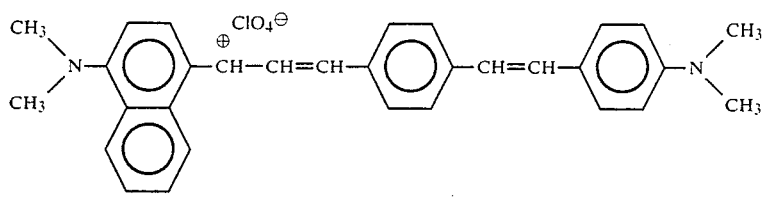 A-(2)
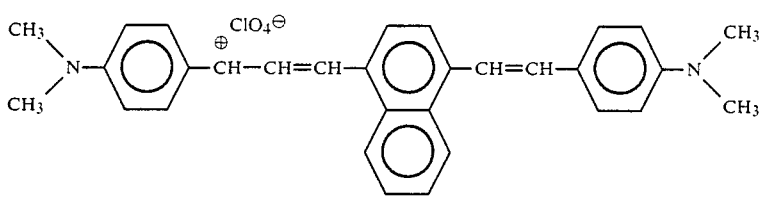 A-(3)
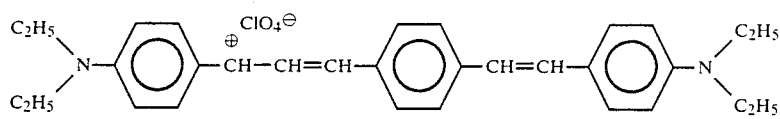 A-(4)
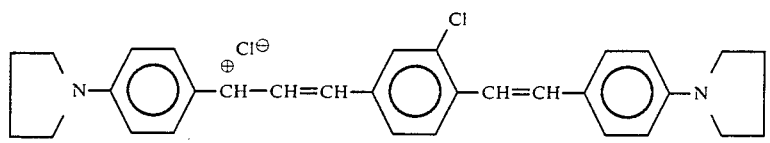 A-(5)
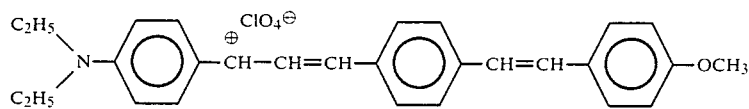 A-(6)
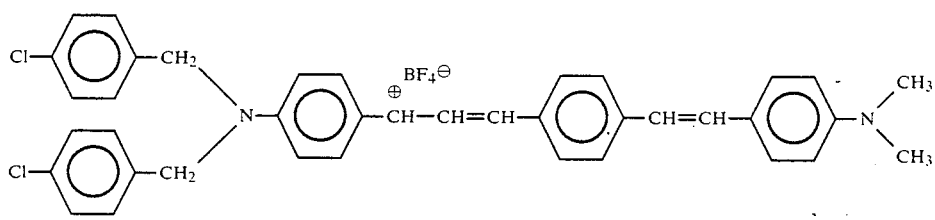 A-(7)
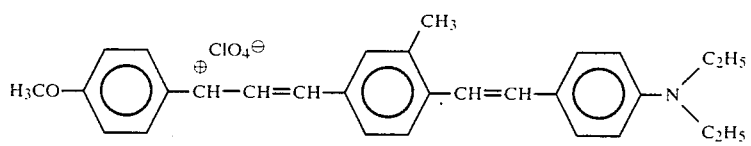 A-(8)
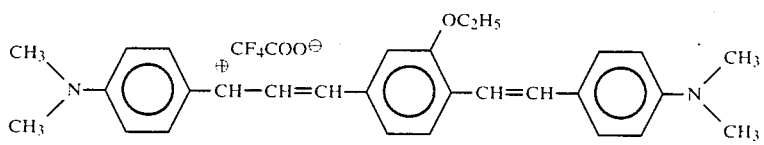 A-(9)

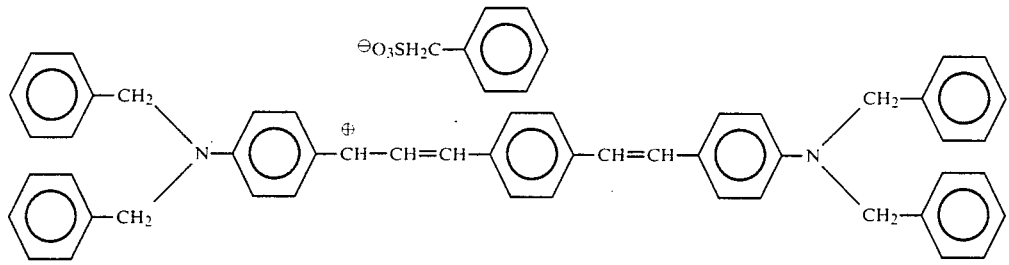
A-(10)
Compounds of the general formula (2)
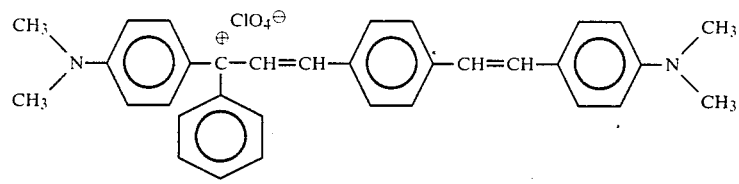
B-(1)
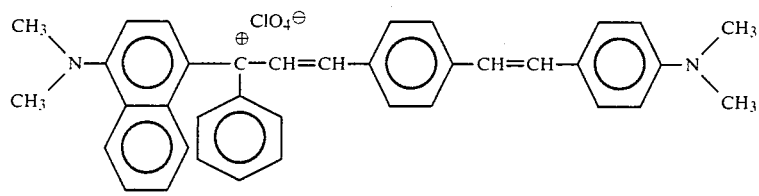
B-(2)
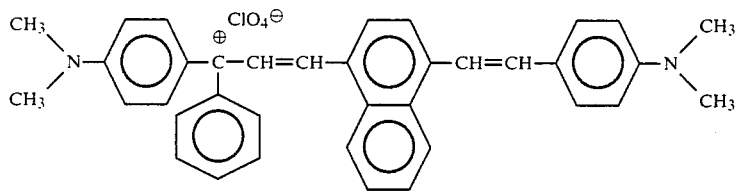
B-(3)
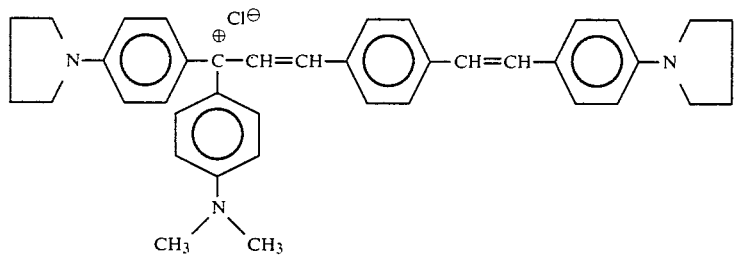
B-(4)
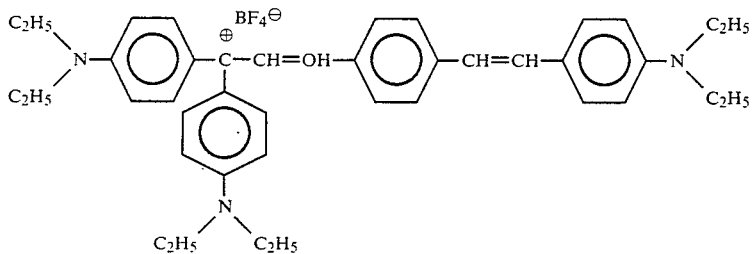
B-(5)
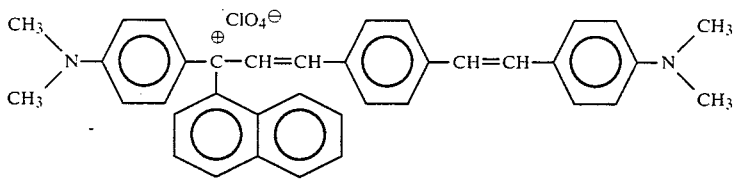
B-(6)

-continued
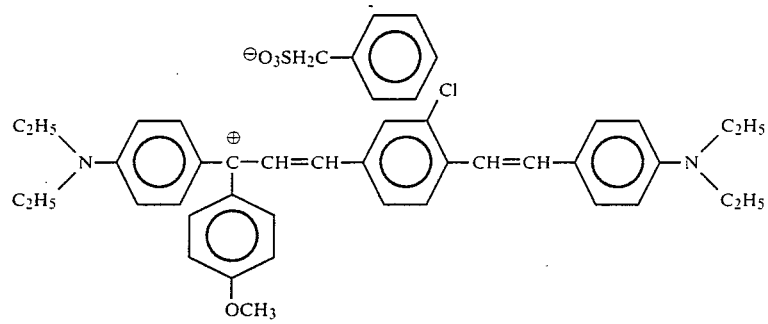
B-(7)
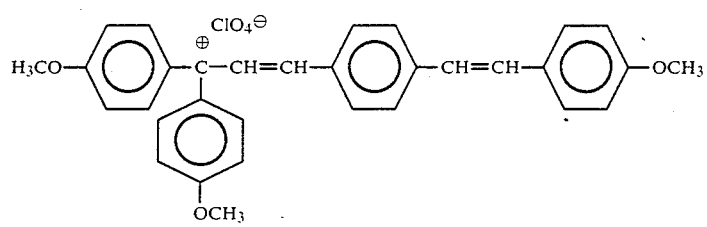
B-(8)
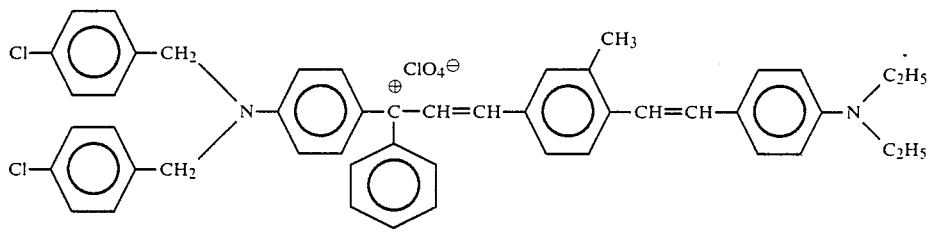
B-(9)
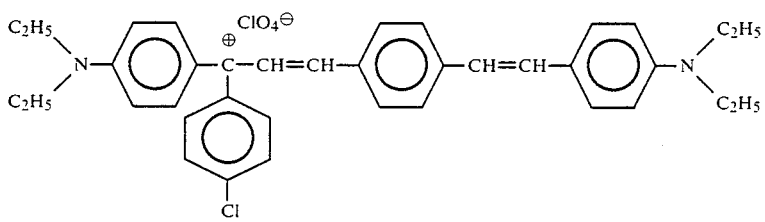
B-(10)
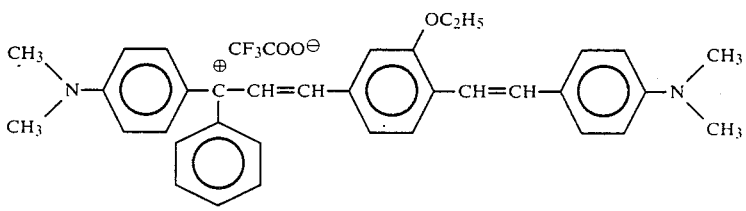
B-(11)
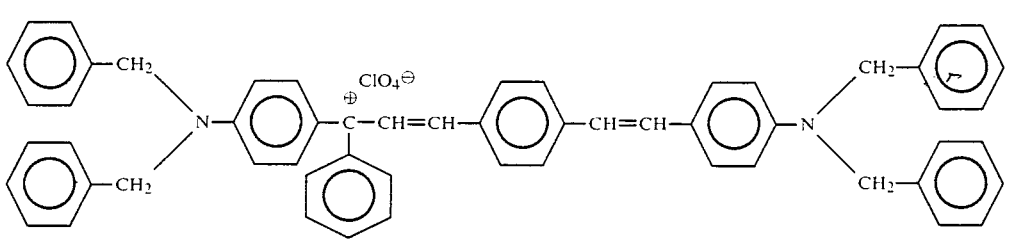
B-(12)

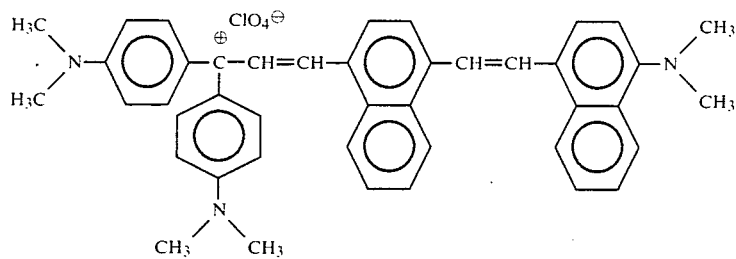
B-(13)
Compounds of the general formula (3)
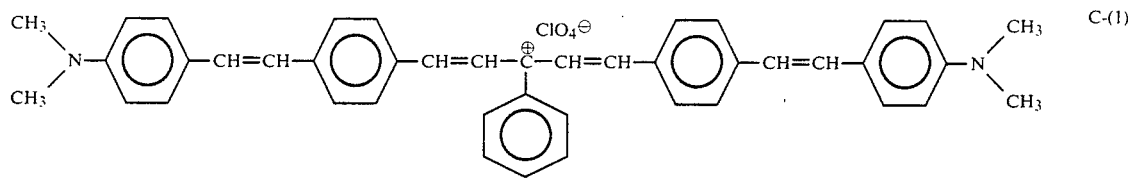
C-(1)
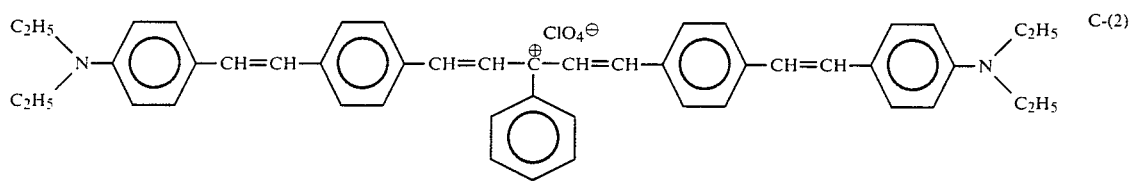
C-(2)
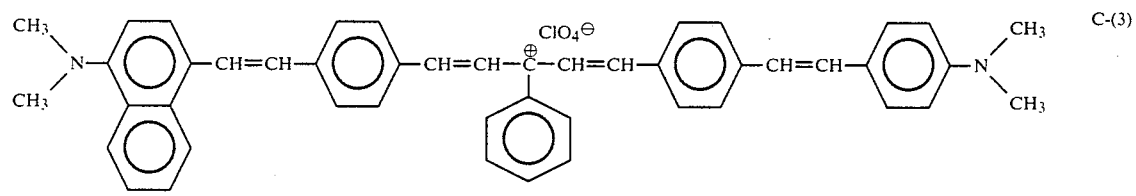
C-(3)
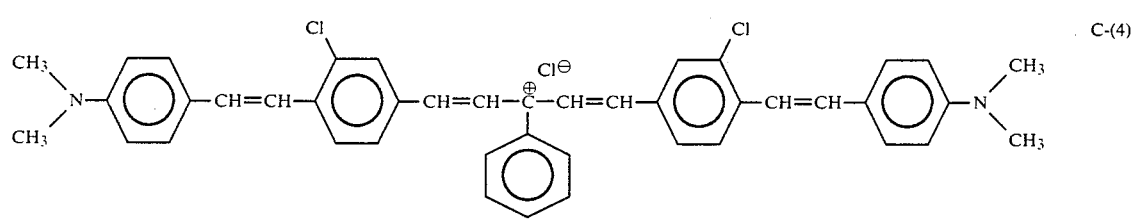
C-(4)
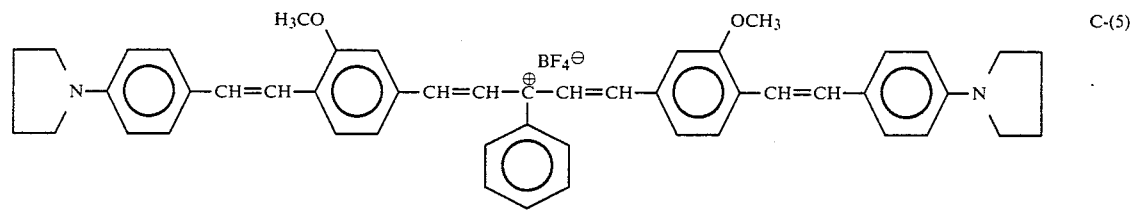
C-(5)
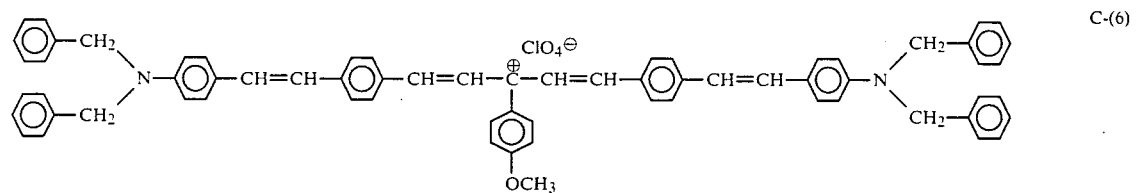
C-(6)

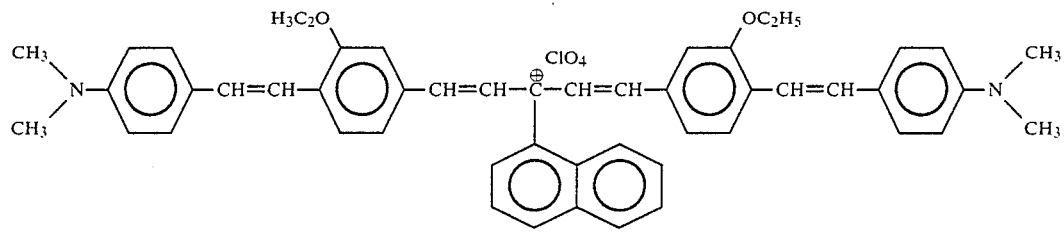
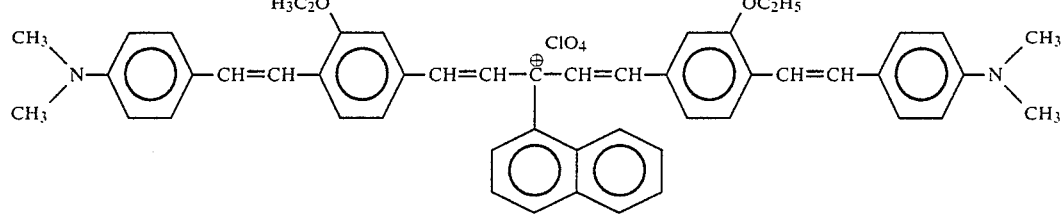
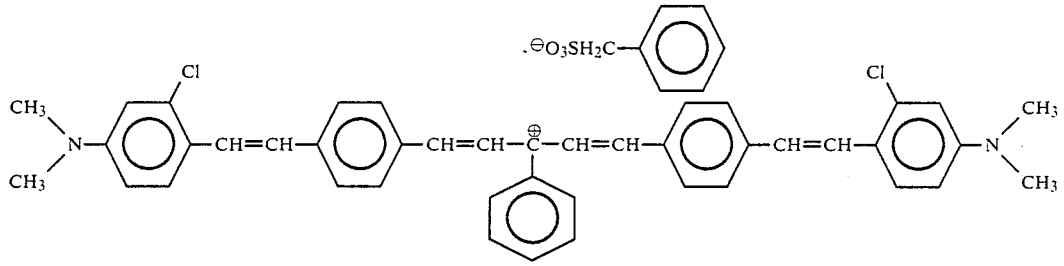
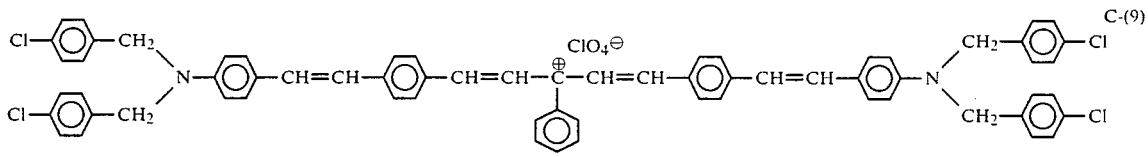
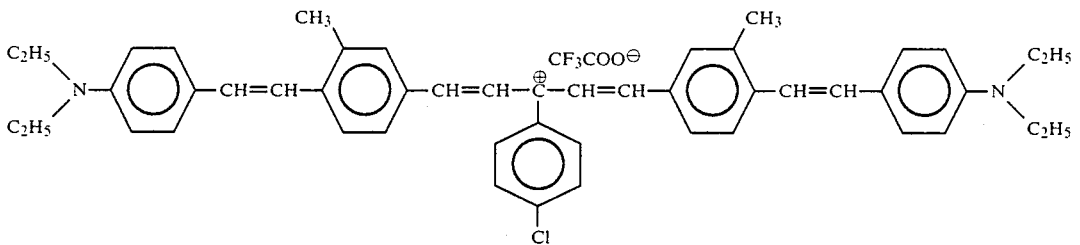
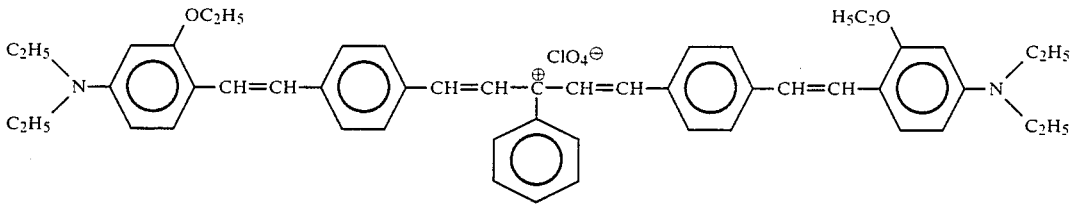
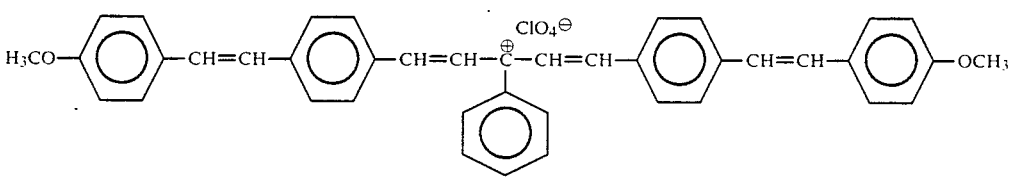
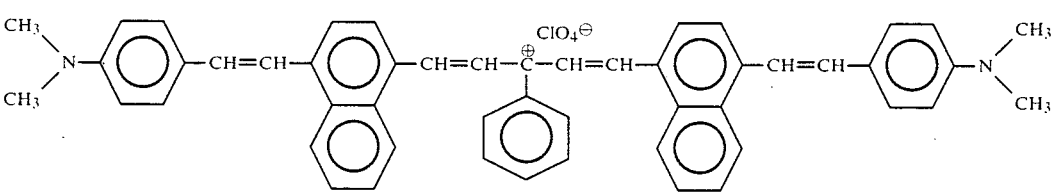
Compound of the general formula (4)

-continued
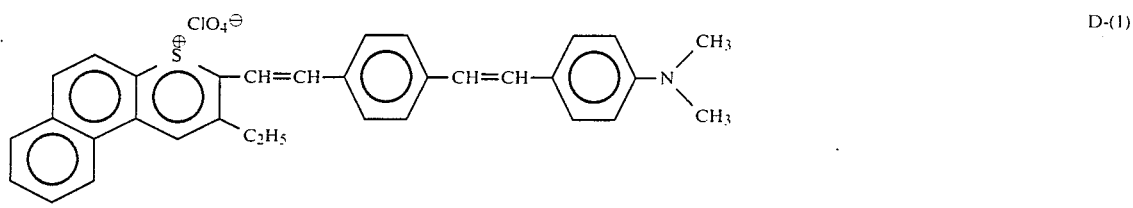
D-(1)
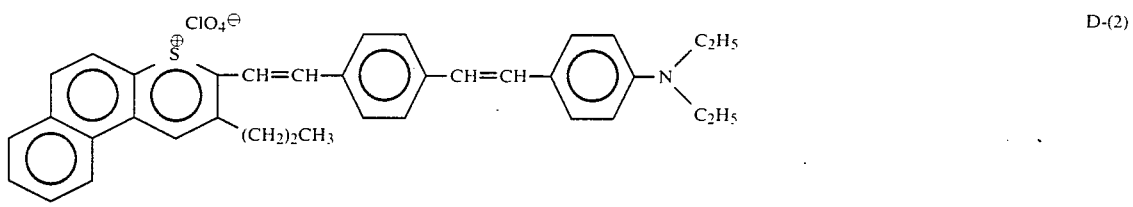
D-(2)
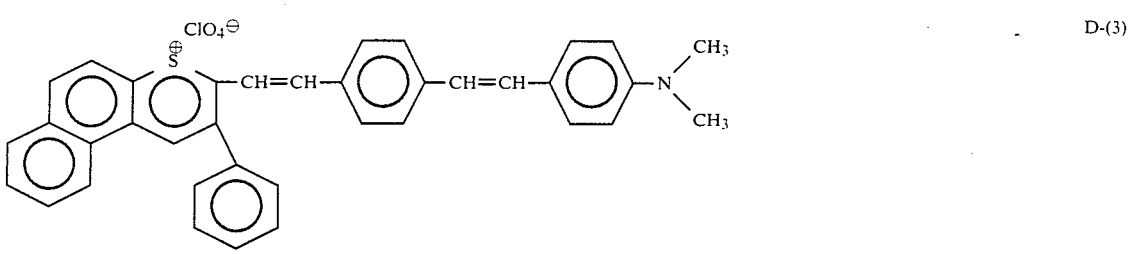
D-(3)
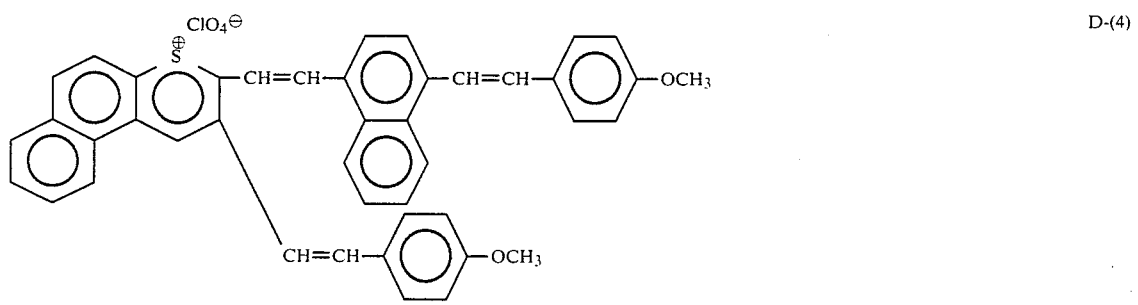
D-(4)
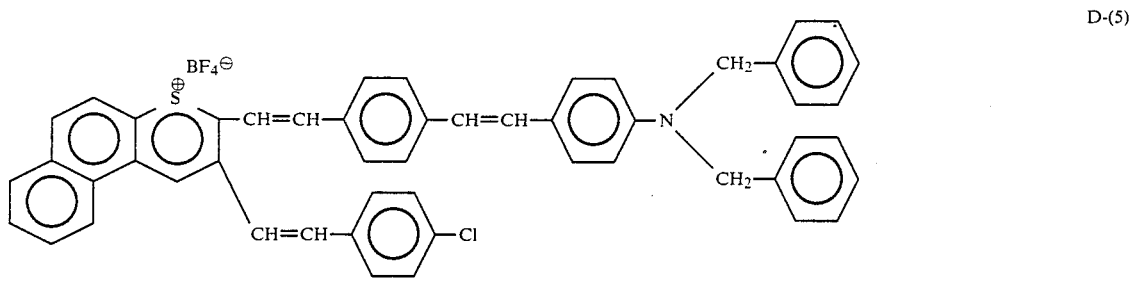
D-(5)
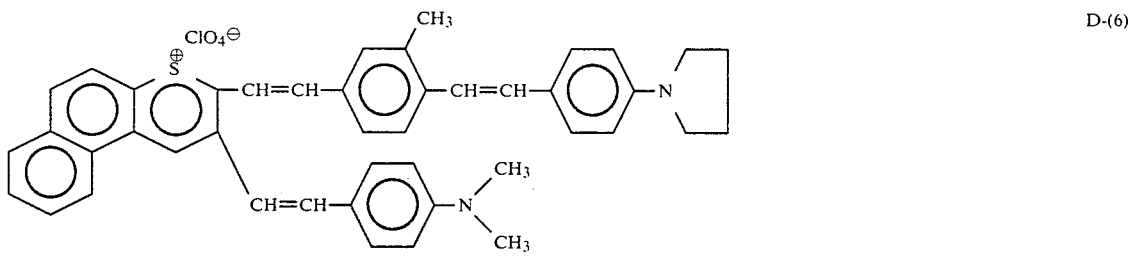
D-(6)

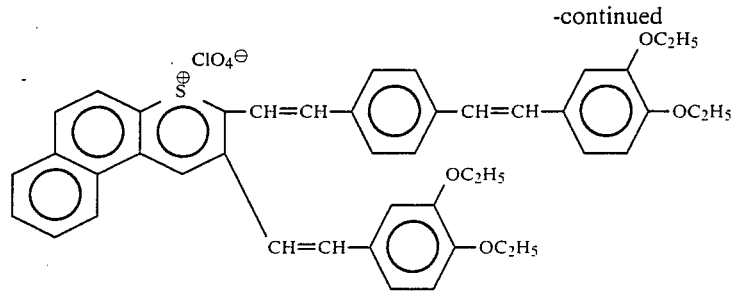
D-(7)
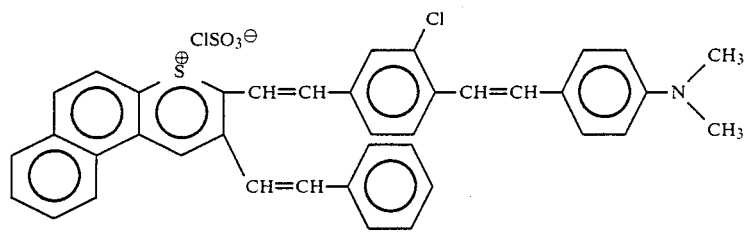
D-(8)
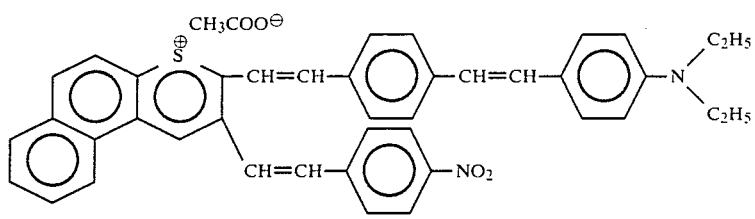
D-(9)
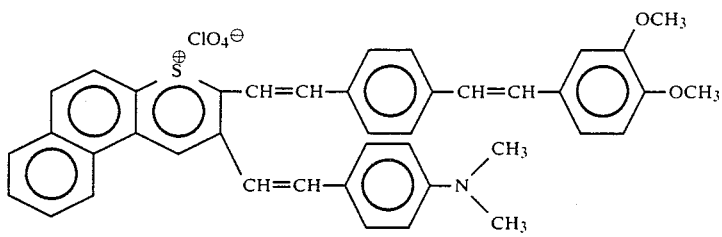
D-(10)
Compounds of the general formula (5)
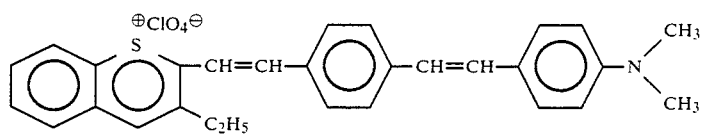
E-(1)
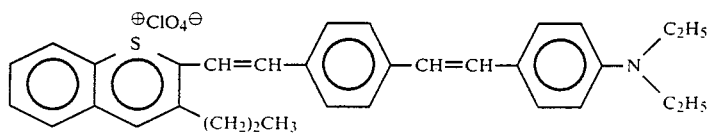
E-(2)
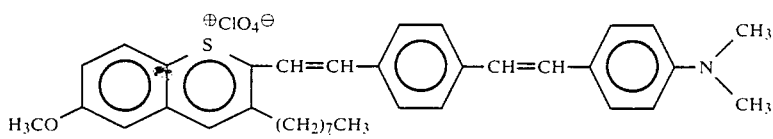
E-(3)
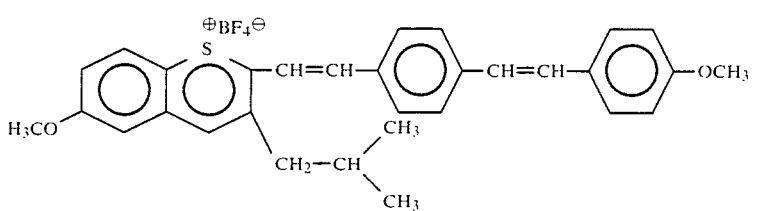
E-(4)

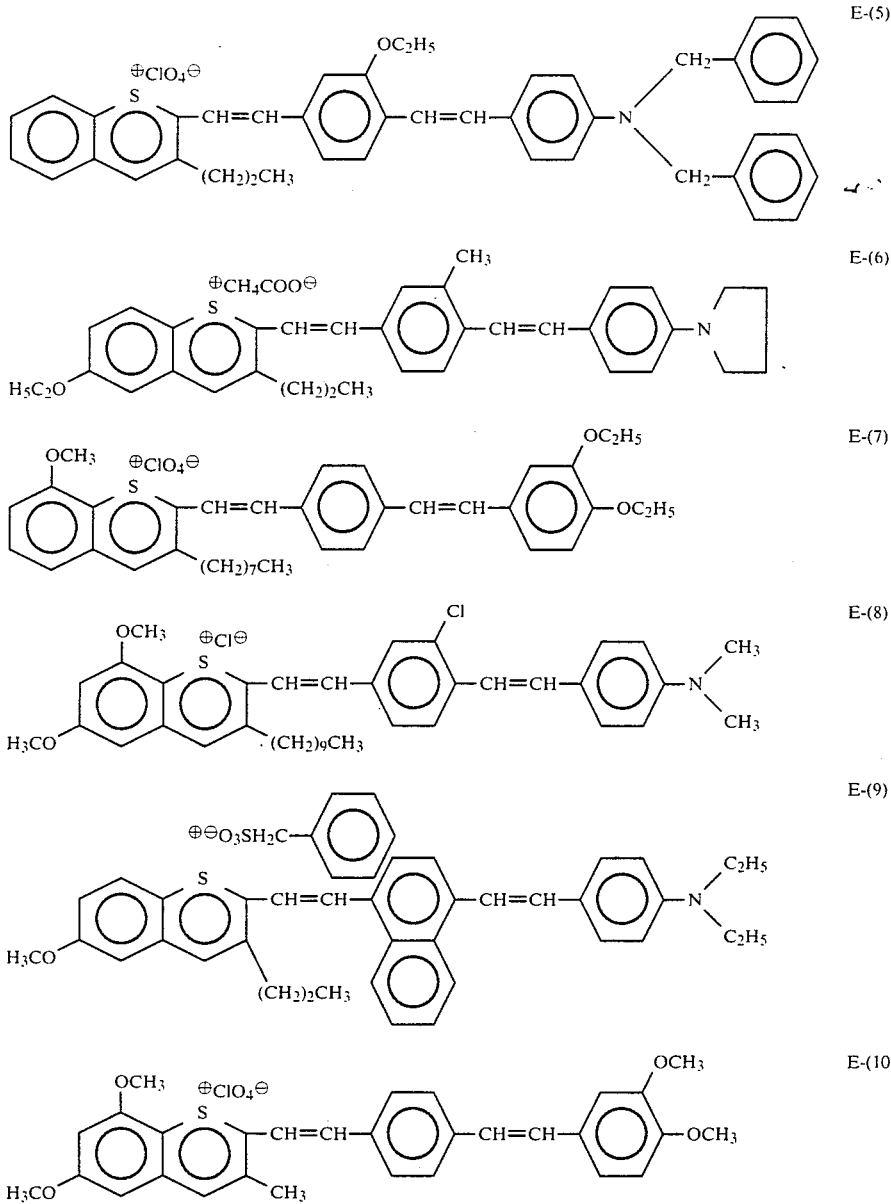

The compound of the formula (1) used in the present invention can be obtained by a condensation reaction of an ethylene derivative of the following formula $$R_{11}-CH=CH_2 \quad \text{(a)}$$

wherein $R_{11}$ is as defined in the formula (1), or a carboxylic acid of the following formula $$R_{11}-CH=CH-COOH \quad \text{(b)}$$

wherein $R_{11}$ is as defined in the formula (1), with an aldehyde of the following formula $$R_{13}-CH=CH-R_{12}-CHO \quad \text{(c)}$$

wherein $R_{12}$ and $R_{13}$ are as defined in the formula (1), in a reaction solvent in a conventional method, for example, described in Ann., 623 204–216.

The compound of the formula (2) used in the present invention can be obtained by a condensation reaction of an ethylene derivative of the following formula $$R_{21}-\underset{\underset{R_{22}}{|}}{C}=CH_2 \quad \text{(d)}$$

wherein $R_{21}$ and $R_{22}$ are as defined in the formula (2), with an aldehyde of the following formula $$R_{24}-CH=CH-R_{23}-CHO \quad \text{(e)}$$

wherein $R_{23}$ and $R_{24}$ are as defined in the formula (2), in a solvent in a conventional method, for example, described in Ann., 623 204–216.

The compound of the formula (3) used in the present invention can be obtained by a condensation reaction of an ethylene derivative of the following formula

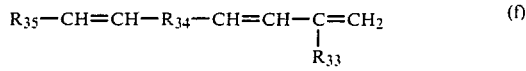

wherein $R_{33}$, $R_{34}$, and $R_{35}$ are as defined in the formula (3), with an aldehyde of the following formula

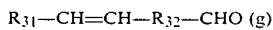

wherein $R_{31}$ and $R_{32}$ are as defined in the formula (3), in a solvent in an conventional method, for example, described in Ann., 623 204–216.

The compound of the formula (4) used in the present invention can be obtained by a condensation reaction of a compound of the following formula

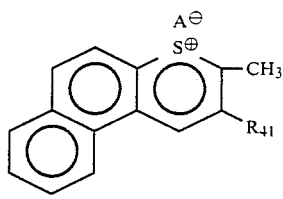

wherein $A^{\ominus}$ and $R_{41}$ are as defined in the formula (4), with an aldehyde of the following formula

wherein $R_{42}$ and $R_{43}$ are as described in the formula (4), in a solvent in a conventional method, for example, described in Japanese Patent Laid-Open No. 121542/1974.

The compound of the formula (5) used in the present invention can be obtained by a condensation reaction of a compound of the following formula

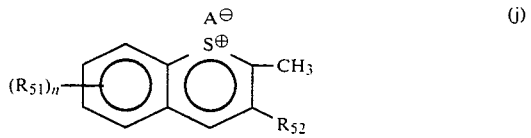

wherein $A^{\ominus}$, $R_{51}$, $R_{52}$, and n are as defined in the formula (5), with an aldehyde of the following formula

wherein $R_{53}$ and $R_{54}$ are as claimed in the formula (5), in a solvent in a conventional method, for example, described in Japanese Patent Laid-open No. 121542/1974.

The organic film of this invention can be used for the optical disk recording; for example, it can be utilized, as shown in FIG. 1, for a recording medium as an organic film 2 formed on a substrate 1. This organic film 2 can be formed from the polymethine compounds of the general formula (1), (2), or (3) or from the thiapyrylium compounds of the general formula (4) or (5), by the vacuum deposition of the above compounds or by applying a coating liquid containing the above compounds and a binder. In the film formed by coating method, the present polymethine or thiapyrylium compounds may be in the state of either dispersion or solution in the binder.

The binder can be selected from a wide variety of resins including; cellulose esters, e.g. nitro-cellulose, cellulose phosphate, cellulose sulfate, cellulose acetate, cellulose propionate, cellulose butyrate, cellulose myristate, cellulose palmitate, cellulose acetate-propionate, and cellulose acetate-butyrate; cellulose ethers, e.g. methylcellulose, ethylcellulose, propylcellulose, and butylcellulose; vinyl type resins, e.g. polystyrene, poly(vinyl chloride, poly(vinyl acetate), poly(vinyl butyral), poly(vinyl acetal), poly(vinyl alcohol, and polyvinylpyrrolidone; copolymers of ethylenic unsaturated compounds, e.g. styrene-butadiene, styrene-acrylonitrile, styrene-butadiene-acrylonitrile, and vinyl chloride-vinyl acetate copolymers; acrylic resins, e.g. poly(methyl methacrylate), poly(methyl acrylate), poly(butyl acrylate), poly(acryli acid), poly(methacrylic acid), polyacrylamide, and polyacrylonitrile; polyester resins, e.g. poly(ethylene terephthate); polycarbonate resins, e.g. poly(4,4'-isopropylidene-diphenylene-CO-1,4-cyclohexylene-dimethylene carbonate), poly(ethylene-dioxy-3,3'-phenylene-thiocarbonate), poly(4,4'-isopropylidenediphenylene carbonate), poly(4,4'-sec-butylidenediphenylene carbonate), and poly(4,4'-isopropylidenediphenylene carbonate-block-oxyethylene), polyarylate resins such as poly(4,4'-isopropylidene-diphenylene carbonate-CO-terephthalate), and other groups of resins such as polyamide resins, polyimides resins, epoxy resins, phenolic resins, and polyolefins resins, e.g. polyethylene, polypropylene, and chlorinated polyethylene.

The organic solvent used for the coating varies depending upon the nature of the binder used and upon the desired state (dispersed or dissolved) of the above compound in the binder. In general, the following solvents can be used: alcohols, e.g. methanol, ethanol, and isopropanol; ketones, e.g. acetone, methyl ethyl ketone, and cyclohexanone; amides, e.g. N,N-dimethyl-formamide and N,N-dimethylacetamide; sulfoxides, e.g. dimethyl sulfoxide; ethers, e.g. tetrahydrofuran, dioxane, and ethylene glycol monomethyl ether; esters, e.g. methyl acetate, ethyl acetate, and butyl acetate; halogenated aliphatic hydrocarbons, e.g. chloroform, methylene chloride, dichloroethylene, carbon tetrachloride, and trichloroethylene; and aromatic solvents, e.g. benzene, toluene, xylene, ligroin, monochlorobenzene, and dichlorobenzene.

The coating can be carried out by various coating methods such as the dip coating, spray coating, spinner coating, bead coating, Meyer bar coating, blade coating, roller coating, and curtain coating methods.

The content of the above mentioned thiapyrylium or polymethine compound in the organic film 2 formed thereof together with the binder ranges generally from 1 to 90%, preferably from 20 to 70%, by weight. Thickness of the organic film 2 prepared by coating and drying or by vapor deposition ranges generally from 0.01 to $10\mu$, preferably from 0.05 to $2\mu$.

The substrate 1 can be made of a plastic, e.g. polyester resin, acrylic resin, polyolefin resin, phenolic resin, epoxy resin, polyamide resin, or polyimide resin, glass, or metal.

Figure 2:
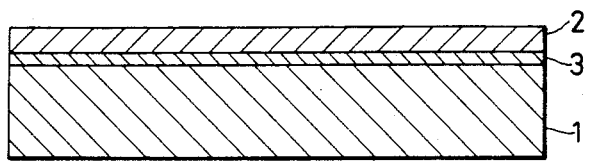

As shown in FIG. 2, a reflecting layer 3 can be laid, in this invention, between the substrate 1 and the organic film 2. The reflecting layer 3 can be formed of a reflecting metal such as aluminum, silver, or chrominum by the vapor deposition or foil lamination.

Figure 3:
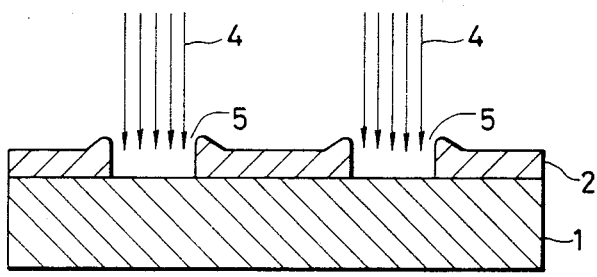
FIG. 3 is a cross-sectional view of such an optical disk in the state of recording or reproduction.

As shown in FIG. 3, pits 5 can be formed in the organic film 2 by irradiation with a converged laser beam 4. The reflectance at the pit 5 can be maximized by making its depth equal to the thickness of the organic film 2. A method of reading the information stored in the organic film 2 is to use a laser beam having the same wavelength but a low intensity as compared with the writing laser beam. Such as laser beam is reflected at the pits to a large extent but absorbed at the pit-free areas. Another reading method is to conduct real-time writing with a laser beam which is absorbable by the organic film 2 and to use another laser beam of different wavelength which can be substantially transmitted by the organic film 2. The reading laser beam is responsive to a variation caused in the reflecting phase by the difference of thickness between the pit and the pit-free area.

Recording on the organic film of this invention can also be carried out by irradiating it with a gas laser such as an argon laser ($\lambda 488$ nm), helium-neon laser ($\lambda 633$ nm), or helium-cadmium laser ($\lambda 442$ nm). It is preferable, however, to carry out recording by the irradiation with a laser having a wavelength of 750 nm of longer, particularly with a laser having a wavelength in the near infrared or infrared region, such as a galium-arsenic laser ($\lambda 780$ nm). For the reading, the above laser can be used. It is possible in this case to carry out the writing and reading with laser beams of either the same or different wavelength.

In other embodiments of this invention, the organic film can be used as a photosensitive layer of electrophotographic photosensitive member. It can also be used as the charge generation layer of an electro-photographic photosensitive member which has two photosensitive layers functioning separately as a charge generation layer and a charge transport layer.

The charge generation layer is desired to contain the present compound, which is also photoconductive, as much as possible for the purpose of attaining a sufficient light absorbance and is additionally desired to be as thin as $0.5\mu$ or less, preferably $0.01$-$1\mu$, for the purpose of minimizing the required distance for generated charge carriers to reach the charge transport layer. This is because the charge generation layer needs to absorb most of the incident light and generate a great number of charge carriers and the generated charge carriers are required to be injected into the charge transport layer without being deactivated by the recombination or trapping.

The charge generation layer can be formed on a substrate by applying a dispersion of the present compound in a suitable binder solution or by vapor deposition of the compound using a vacuum-deposition apparatus. The binder used in the coating can be selected from a wide variety of insulating resins and from organic photoconductive polymers such as poly(N-vinylcarbazole), polyvinylanthracene, and polyvinylpyrene. Preferably, the binder is selected from insulating resins, e.g. poly(vinyl butyral), polyarylate resins (such as a bisphenol A-phthalic acid polycondensation product), polycarbonate resins, polyester resins, phenoxy resins, poly(vinyl acetate), acrylic resin, polyacrylamide, polyamide resins, polyvinylpyridine, cellulose resins, urethane resins, epoxy resins, casein, poly(vinyl alcohol), and polyvinylpyrrolidone. The content of the binder resin in the charge generation layer is desirably up to 80%, preferably up to 40%, by weight.

The solvent used for dissolving the binder varies depending upon the nature of the binder used and is desired to be selected from those which do not dissolve the charge transport layer or the undercoating layer, which are discribed later. For example, the following solvents can be used: alcohols, e.g. methanol, ethanol, and isopropanol; ketones, e.g. acetone, methyl ethyl ketone, and cyclohexanone; amides, e.g. N,N-dimethylformamide and N,N-dimethylacetamide; sulfoxides, e.g. dimethylsulfoxide; ethers, e.g. tetrahydrofuran, dioxane, and ethylene glycol monomethyl ether; esters, e.g. methyl acetate and ethyl acetate; halogenated aliphatic hydrocarbons, e.g. chloroform, methylene chloride, dichloroethylene, carbon tetrachloride, and trichloroethylene; and aromatic solvents, e.g. benzene, toluene, xylene, ligroin, monochlorebenzene, and dichlorobenzene.

The coating can be carried out by various coating methods such as the dip coating, spray coating, spinner coating, bead coating, Meyer bar coating, blade coating, roller coating, and curtain coating methods. The drying is favorably carried out by heating after setting to touch. The heat drying can be accomplished at a temperature of 30°-200° C. for 5 minutes to 2 hours with or without blowing air.

The charge transport layer electrically is communicated to the charge generation layer and has the function capable of receiving the charge carriers injected from the charge generation layer and transporting them to its surface. This charge transport layer may be laid on the upper or lower side of the charge generation layer, but preferably on the upper side.

The substance which transports the charge carriers in the charge transport layer (hereinafter, the substance is simply referred to as "charge-transporting material") is desired to be substantially insensitive to the electromagnetic waves to which the charge generation layer is sensitive. The electromagnetic waves herein referred to mean the light in a wide sense including $\gamma$ rays, X-rays, utraviolet rays, visible rays, near infrared rays, infrared rays, and for infrared rays. When the wavelength region of the rays to which the charge transport layer is sensitive agrees with or laps over that of the rays to which the charge generation layer is sensitive, charge carries generated in one of the layers will trap those generated in the other layer, thus resulting in deteriorated sensitivity of the layers.

The charge-transporting materials are divided into electron-transporting materials and hole-transporting materials. The electron-transporting materials include electron attractive substances such as chloranil, bromanil, tetracyanoethylene, tetracyanoquinodimethane, 2,4,7-trinitro-9-fluorenone, 2,4,5,7-tetranitro-9-fluorenone, 2,4,7-trinitro-9-dicyanomethylenefluorenone, 2,4,5,7-tetranitroxanthone, 2,4,8-trinitrothioxanthone, and polymers derived from these electron attractive compounds.

The hole-transporting materials include pyrene, N-ethylcarbazole, N-isopropylcarbazole; hydrazones such as N-methyl-N-phenylhydrazino-3-methylidene-9-ethylcarbazole, N,N-diphenylhydrazino-3-methylidene-9-ethylcarbazole, N-N-diphenylhydrazino-3-methylidene-10-ethylphenothiazine, N,N-diphenylhydrazino-3-methylidene-10-ethylphenoxazine, p-diethylaminobenzaldehyde-N,N-diphenylhydrazone, p-diethylaminobenzaldehyde-N-α-naphthyl-N-phenylhydrazone, p-pyrrolidinobenzaldehyde-N,N-diphenylhydrazone, 1,3,3-trimethylindolenine-ω-aldehyde-N,N-diphenylhydrazone, and p-diethylbenzaldehyde-3-methylbenzthiazolinone-2-hydrazone; 2,5-bis(p-diethylaminophenyl)-1,3,4-oxadiazole; pyrazoline derivatives such as 1-phenyl-3-(p-diethylaminostyryl)-5-(p-diethylaminophenyl)pyrazoline, 1-[quinolyl(2)]-3-(p-diethylaminostyryl)-5-(p-diethylaminophenyl)pyrazoline, 1-[pyridyl(2)]-3-(p-diethylaminostyryl)-5-(p-diethylaminophenyl)pyrazoline, 1-[6-methoxypyridyl(2)]-3-(p-diethylaminostyryl)-5-(p-diethylaminophenyl)-pyrazoline, 1-[pyridyl(3)]-3-(p-diethylaminostyryl)-5-(p-diethylaminophenyl)pyrazoline, 1-[lepidyl(2)]-3-(p-diethylaminostyryl)-5-(p-diethylaminophenyl)pyrazoline, 1-[pyridyl(2)]-3-(p-diethylaminostyryl)-4-methyl-5-(p-diethylaminophenyl)pyrazoline, 1-[pyridyl(2)]-3-($\alpha$-methyl-p-diethylaminostyryl)-5-(p-diethylaminophenyl)pyrazoline, 1-phenyl-3-(p-diethylaminostyryl)-4-methyl-5-(p-diethylaminophenyl)pyrazoline, 1-phenyl-3-($\alpha$-benzyl-p-diethylaminostyryl)-5-(p-diethylaminophenyl)pyrazoline, and spiropyrazoline; oxazole derivatives such as 2-(p-diethylaminostyryl)-6-diethylaminobenzoxazole and 2-(p-diethylaminophenyl)-4-(p-dimethylaminophenyl)-5-(2-chlorophenyl)oxazole; thiazole derivatives such as 2-(p-diethylaminostyryl)-6-diethylaminobenzothiazole; triarylmethanes such as bis(4-diethylamino-2-methylphenyl)-phenylmethane; polyarylalkanes such as 1,1-bis(4-N,N-diethylamino-2-methylphenyl)heptane and 1,1,2,2-tetrakis(4-N,N-dimethylamino-2-methylphenyl)ethane; triphenylamine; and resins such as poly(N-vinyl-carbazole), polyvinylpyrene, polyvinylanthracene, polyvinylacridine, poly(9-vinylphenylanthracene), pyrene-formaldehyde resin, and ethylcarbazole-formaldehyde resin.

Inorganic materials such as selenium, selenium-tellurium, amorphous silicon, and cadmium sulfide can also be used besides these organic charge-transporting materials.

These charge-transporting materials can be used individually or in combination.

When the charge-transporting material does not have the film-forming property, the film can be formed by adding a suitable binder. Suitable binders in this case include; insulating resins, e.g. acrylic resin, polyarylate, polyester resins, polycarbonate resins, polystyrene, acrylonitrile-styrene copolymer, acrylonitrile-butadiene copolymer, poly(vinyl butyral), poly(vinyl formal), polysulfone, polyacrylamide, polyamide resins, and chlorinated rubber; and organic photoconductive polymers, e.g. poly(N-vinylcarbazole), polyvinylanthracene, and polyvinylpyrene.

Since the charge carrier transportation distance is limited, the thickness of the charge transport layer cannot be increased more than needs. The thickness is generally 5–30$\mu$, preferably 8–20$\mu$. When the charge transport layer is formed by coating, coating methods as cited above are applicable.

The photosensitive laminate comprising the charge generation layer and the charge transport layer is formed on a conductive substrate. Suitable substrates for this purpose are; sheets or the like of metals, which are electrically conductive in themselves, e.g. aluminum, aluminum alloy, copper, zinc, stainless steel, vanadium, molybdenum, chromium, titanium, nickel, indium, gold, and platinum; those of plastics, e.g. polyethylene, polypropylene, poly(vinyl chloride), poly(ethylene terephthalate), acrylic resins, and polyfluoroethylene, which have a conductive coating layer formed by vacuum deposition of aluminum, aluminum alloy, indium oxide, tin oxide, indium oxide-tin oxide alloy, or the like; those of plastics coated with conductive particles, e.g. carbon black, silver particles, or the like, together with a suitable binder; those of plastics and paper impregnated with conductive particles; and those of plastics containing a conductive polymer.

An undercoating layer which functions as a barrier and as a bonding agent can be laid between the conductive layer and the photosensitive layer. This undercoating layer can be made of, e.g. casein, poly(vinyl alcohol), nitrocellulose, ethylene-acrylic acid copolymer, polyamide resins (nylon 6, nylon 66, nylon 610, copolymerized nylon, alkoxymethylated nylon, or the like, polyurethane resins, gelatin, or aluminum oxide.

Suitable thickness of the undercoating layer ranges from 0.1 to 5$\mu$, preferably from 0.5 to 3$\mu$.

For operating the photosensitive member comprising a conductive layer, charge generation layer, and charge transport layer laminated in that order, the surface of the charge transport layer needs to be positively charged when the charge-transporting material used is electron-transportive. On image-exposing the photosensitive member positively charged, electrons generated in the charge generation layer, in the exposed region, are injected into the charge transport layer, then arrive at the surface, and neutralize the positive charge to decay the surface potential, thus forming an electrostatic contrast to the unexposed region. The thus formed electrostatic latent images, on developing with a negative-working toner, give visible images. This visible images can be fixed directly or after its transferring onto paper or a plastic film.

Alternatively, the electrostatic latent images formed on the photosensitive member can be transferred onto the insulating layer of transfer paper, and then developed and fixed. Any known developer, developing process, and fixing process can be applied in this case; there is no restriction.

On the contrary, when the charge-transporting material used is hole-transportive, the surface of the charge transport layer needs to be negatively charged. On image-exposing the photosensitive member negatively charged, holes produced in the charge generation layer, in the exposed region, are injected into the charge transport layer, then arrive at the surface, and neutralize the negative charge to decay the surface potential, thus forming an electrostatic contrast (electrostatic latent image) to the unexposed region. For developing this, a positive-working toner needs to be used contrary to the case where an electron-transporting material is used.

In another embodiment of this invention, an organic film containing the present polymethine or thiapyrylium compound can be used as a sensitizer for another organic or inorganic photoconductive material being the main component of the film. The organic photoconductive substance is selected from, for example, the above cited hydrozones, pyrazoline compounds, oxazole compounds, thiazole compounds, triarylmethanes, polyarylalkanes, triphenylamine, and poly(N-vinylcarbazole) and the inorganic photoconductor is selected from, for example, zinc oxide, cadmium sulfide, and selenium. This organic film is formed of the photoconductive material, the present compound, and a binder by coating method. Another embodiment of this invention is an organic film usable as the photosensitive layer of an electrophotographic photosensitive member, said film comprising the present compound (the polymethine and thiapyrylium compounds) and a binder.

Any photosensitive member according to this invention contains at least one photosensitive compound selected from the compounds represented by the general formulae (1)–(5). If desired for the purpose of enhancing the sensitivity of a photosensitive member or providing a panchromatic photosensitive member, it is possible to use the present photosensitive compounds in combination with each other or with another charge-generating material selected from known dyes or pigments.

The organic film of this invention can be used not only as a laser-responsive film for optical-disk recording media or for electrophotographic photosensitive members but also as a light absorber for infrared-cutting filters, solar cells, or photosensors. Such a solar cell may be of a sandwich structure having the present organic film between an indium oxide electrode and an aluminum electrode.

The organic film of this invention, as compared with the prior art laser-sensitive film for electrophotography, is exceedingly sensitive to rays of wavelengths 750 nm or longer. The present organic film is highly sensitive and exhibits an improved S/N ratio as compared also with the optical-disk recording medium of the prior art. Another advantage of this invention is that the present photosensitive compound is markedly stable to heat notwithstanding the absorption peak being at a wavelength of 750 nm or longer.

This invention is illustrated further with reference to the following Examples: In these Examples, "parts" and "%" are by weight.

EXAMPLE 1

A solution of casein in aqueous ammonia [casein (11.2 g), 28% aqueous ammonia (1 g), and water (222 ml)] was applied on the surface of an aluminum cylinder by dipping and dried to form an undercoating layer of 1.0 g/m$^2$ in coating weight.

One part of the above listed compound No. A-(1), 1 part of a vinyl butyral resin (Eslec BM-2, mfd. by Sekisui Chem. Co., Ltd.), and 30 parts of isopropanol were dispersed in a ball-mill for 4 hours. The resulting dispersion was applied to the undercoating layer by dipping and dried to form a charge generation layer 0.3μ thick.

One part of p-diethylaminobenzaldehyde-N-phenyl-N-α-naphthylhydrazone and 1 part of a polysulfone resin (P-1700, mfd. by Union Carbide Corp.) were mixed with 6 parts of monochlorobenzene to be solved by stirring. The resulting solution was applied to the charge generation layer by dipping and dried to form a charge transport layer 12μ thick.

The thus prepared photosensitive member was measured for the surface potential immediately after being corona-charged at $-5$ KV (initial potential $V_0$) and after being left in the dark for 5 seconds from the charging (dark decay potential $V_5$). The sensitivity was evaluated by measuring the exposure quantity ($E_{\frac{1}{2}}$ microjoule/cm$^2$) for halving potential $V_5$ after the dark decay. A gallium-aluminum-arsenic semiconductor laser (λ780 nm) was used as a light source. The results were as follows:

$V_0$: $-490$ V
$V_5$: $-475$ V
$E_{\frac{1}{2}}$: 5.7 μJ/cm$^2$

In the following Examples 2-66, charge bearing characteristics of photosensitive members were evaluated in the same manner as described above unless otherwise noted.

EXAMPLES 2-56

Photosensitive members were prepared in the same manner as in Example 1 except for using the compound shown in Table 1 in place of the compound No. A-(1).

Results of measuring charge bearing characteristics thereof are shown in Table 1.

TABLE 1

| Example No. | Compound No. | $V_0(-V)$ | $V_5(-V)$ | $E_{1/2}(\mu J/cm^2)$ |
|---|---|---|---|---|
| 2 | A-(2) | 540 | 520 | 6.2 |
| 3 | A-(3) | 490 | 475 | 6.6 |
| 4 | A-(4) | 470 | 460 | 5.8 |
| 5 | A-(5) | 485 | 470 | 5.7 |
| 6 | A-(6) | 535 | 515 | 6.5 |
| 7 | A-(7) | 560 | 550 | 6.7 |
| 8 | A-(8) | 490 | 475 | 6.3 |
| 9 | A-(9) | 525 | 515 | 6.0 |
| 10 | A-(10) | 555 | 545 | 6.9 |
| 11 | B-(1) | 475 | 460 | 5.3 |
| 12 | B-(2) | 505 | 485 | 5.8 |
| 13 | B-(3) | 495 | 470 | 6.1 |
| 14 | B-(4) | 480 | 465 | 5.1 |
| 15 | B-(5) | 475 | 450 | 4.9 |
| 16 | B-(6) | 490 | 470 | 5.9 |
| 17 | B-(7) | 510 | 500 | 6.0 |
| 18 | B-(8) | 530 | 525 | 6.3 |
| 19 | B-(9) | 520 | 505 | 5.7 |
| 20 | B-(10) | 500 | 485 | 5.6 |
| 21 | B-(11) | 495 | 475 | 5.2 |
| 22 | B-(12) | 540 | 535 | 6.5 |
| 23 | B-(13) | 540 | 530 | 4.0 |
| 24 | C-(1) | 470 | 440 | 3.5 |
| 25 | C-(2) | 490 | 470 | 3.3 |
| 26 | C-(3) | 540 | 525 | 3.7 |
| 27 | C-(4) | 470 | 450 | 3.5 |
| 28 | C-(5) | 495 | 480 | 3.7 |
| 29 | C-(6) | 530 | 520 | 4.4 |
| 30 | C-(7) | 500 | 485 | 4.2 |
| 31 | C-(8) | 555 | 535 | 3.8 |
| 32 | C-(9) | 565 | 550 | 4.5 |
| 33 | C-(10) | 515 | 500 | 4.6 |
| 34 | C-(11) | 485 | 465 | 3.5 |
| 35 | C-(12) | 560 | 550 | 4.8 |
| 36 | C-(13) | 505 | 490 | 3.8 |
| 37 | D-(1) | 480 | 465 | 9.8 |
| 38 | D-(2) | 490 | 470 | 10.3 |
| 39 | D-(3) | 475 | 450 | 9.5 |
| 40 | D-(4) | 490 | 465 | 8.8 |
| 41 | D-(5) | 480 | 455 | 11.0 |
| 42 | D-(6) | 500 | 480 | 10.1 |
| 43 | D-(7) | 470 | 445 | 8.5 |
| 44 | D-(8) | 485 | 460 | 9.5 |
| 45 | D-(9) | 480 | 460 | 11.2 |
| 46 | D-(10) | 490 | 480 | 10.8 |
| 47 | E-(1) | 470 | 445 | 10.2 |
| 48 | E-(2) | 480 | 450 | 9.2 |
| 49 | E-(3) | 465 | 440 | 8.7 |
| 50 | E-(4) | 480 | 455 | 8.9 |
| 51 | E-(5) | 490 | 475 | 11.1 |
| 52 | E-(6) | 470 | 455 | 10.8 |
| 53 | E-(7) | 465 | 445 | 8.4 |
| 54 | E-(8) | 470 | 450 | 8.1 |
| 55 | E-(9) | 485 | 470 | 9.5 |
| 56 | E-(10) | 465 | 445 | 8.3 |

EXAMPLE 57-61

A solution of casein in aqueous ammonia (the same as used in Example 1) was applied to a 100-μ thick aluminum sheet and dried to form an undercoating layer 1.1μ thick.

A charge-transfer complex was prepared by dissolving 5 g of 2,4,7-trinitro-9-fluorenone and 5 g of a poly(N-vinylcarbazole) (number average mol. wt. 300,000) in 70 ml of tetrahydrofuran. The resulting charge-transfer complex (1 g) and 1 g of a compound shown in Table 2 were dispersed in a solution of 5 g of a polyester resin (Vylon, mfd. by Toyobo Co., Ltd.) in 70 ml of tetrahydrofuran. This dispersion was applied to the undercoating layer so as to give a dry thickness of 12μ, and was dried.

Thus, photosensitive members were prepared by using the compounds shown in Table 2. Results of measuring the charge bearing characteristics thereof are shown in Table 2.

In the measurements, the charging polarity was positive.

TABLE 2

| Example No. | Compound No. | $V_0(+V)$ | $V_5(+V)$ | $E1/2(lux.sec)$ |
|---|---|---|---|---|
| 57 | A-(1) | 540 | 525 | 7.7 |
| 58 | B-(1) | 580 | 555 | 7.2 |
| 59 | C-(1) | 570 | 545 | 6.0 |
| 60 | D-(3) | 510 | 485 | 12.5 |
| 61 | E-(1) | 500 | 485 | 10.4 |

EXAMPLES 62-66

An aluminum layer vapor-deposited on a poly(ethylene terephthalate) film was coated with poly(vinyl alcohol) to a coating thickness of $1.1\mu$.

One part of a compound shown in Table 3, 1 part of a vinyl butyral resin (the same as used in Example 1), and 30 parts of isopropanol were dispersed in a ball-mill for 4 hours. The resulting dispersion was applied to the poly(vinyl alcohol) undercoat by means of a Meyer bar so as to give a dry thickness of $0.5\mu$ and was dried to form a charge generation layer.

A solution prepared by dissolving 5 g of a pyrazoline compound of the formula

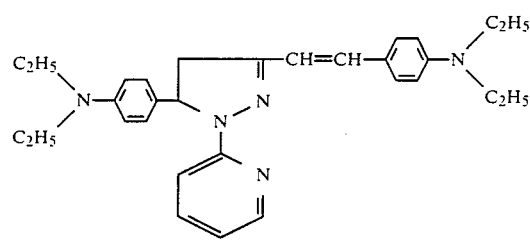

and 5 g of a polyarylate (a polycondensation product of bisphenol A with a terephthalic acid-isophthalic acid mixture) in 70 ml of tetrahydrofuran was applied to the charge generation layer so as to give a dry thickness of $10\mu$ and was dried to form a charge transport layer.

Photosensitive members were prepared in this way by using the compounds shown in Table 3 as charge-generating materials. Charge bearing characteristics thereof are shown in Table 3.

TABLE 3

| Example No. | Compound No. | $V_0(-V)$ | $V_5(-V)$ | $E1/2(\mu J)$ |
|---|---|---|---|---|
| 62 | A-(4) | 530 | 520 | 5.9 |
| 63 | B-(7) | 460 | 435 | 5.5 |
| 64 | C-(1) | 455 | 435 | 3.0 |
| 65 | D-(4) | 470 | 450 | 11.2 |
| 66 | E-(4) | 525 | 505 | 9.8 |

As can be seen from Examples 1-66, electrophotographic photosensitive members provided with an organic film of this invention exhibit high sensitivity to rays of wavelengths of 750 nm or longer and are excellent in such charge bearing characteristics as the original potential and dark decay potential.

EXAMPLES 67-71

A coating liquid was prepared by thorough mixing 12 parts of a nitrocellulose solution (OH-Less Lacquer: a 25 weight % solution of nitrocellulose in methyl ethyl ketone, mfd. by Daicel Chem. Ind. Co., Ltd.), 3 parts each of the compounds No. A-(2), B-(4), C-(4), D-(4), and E-(2), and 70 parts of methyl ethyl ketone. Each coating liquid was applied by dipping to an aluminum layer vapor-deposited on a glass disk and was dried to form a recording layer of $0.6 g/m^2$. Thus, optical disks having the above five compounds, respectively, in the recording layer were obtained.

The sample of these optical disks was placed on a turntable and irradiated with a 5-mW, 8-MHz gallium-aluminum-arsenic semiconductor laser beam ($\lambda$780 nm) converged to a spot size of $1.0\mu$, while rotating the turntable at a speed of 1800 r.p.m. by means of a motor, so as to form a track of pits.

Scanning electron microscopic observations recognized distinct pits on the sample faces of all the irradiated disks. The track of pits was traced with a low-power gallium-aluminum-arsenic semiconductor laser beam and the reflected light was detected. As a result, all the samples gave pulses of sufficiently high S/N ratio.

EXAMPLES 72-89

Optical disks were prepared by vapor deposition of the above listed compounds No. A-(3), A-(5), A-(6), A-(8), B-(2), B-(3), B-(6), B-(10), C-(5), C-(8), C-(11), C-(13), D-(5), D-(10), E-(3), E-(5), E-(6), and E-(8).

A molybdenum boat containing 500 mg each of these compounds was placed in a vacuum chamber for vapor-deposition, together with a glass disk overlaid with vapor-deposited aluminum. The chamber was evacuated to a vacuum of $1 \times 10^{-6}$ mm Hg or less. Then, while controlling a heater so as not to raise the pressure in the chamber higher than $1 \times 10^{-5}$ mm Hg, the compound was vapor-deposited on the aluminum surface to form a deposition film of $0.2\mu$ thickness.

In the same manner as in Examples 67-71, information was recorded on the thus prepared optical disks, giving distinct pits similarly to Examples 67-71. Results of reproducing the information in the same manner as in Examples 67-71 showed sufficiently high S/N ratio for all the optical disks tested.

What is claimed is:

1. An electrophotographic photosensitive member having a conductive substrate and a photosensitive layer which comprises at least one compound of the following formulae (1)-(5), and a binder:

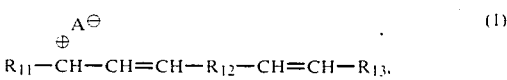

wherein $R_{11}$ and $R_{13}$ each represent substituted or unsubstituted aryl, $R_{12}$ represents substituted or or unsubstituted arylene, and $A^{\ominus}$ represents an anionic residue;

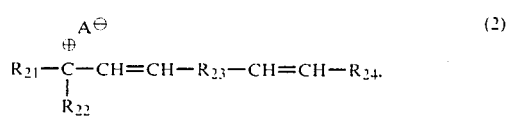

wherein $R_{21}$, $R_{22}$, and $R_{24}$ each represent substituted or unsubstituted aryl, $R_{23}$ represents substituted or unsubstituted arylene, and $A^{\ominus}$ represents an anionic residue;

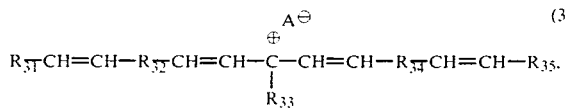
(3)

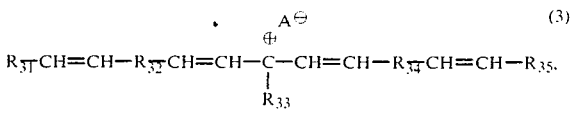
(3)

wherein $R_{31}$, $R_{33}$, and $R_{35}$ each represent substituted or unsubstituted aryl, $R_{32}$ and $R_{34}$ each represent substituted or unsubstituted arylene, and $A^\ominus$ represents an anionic residue;

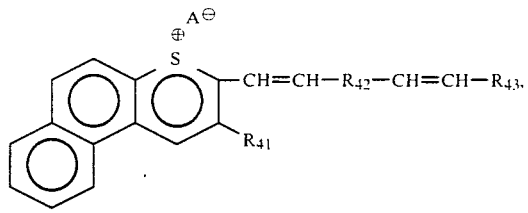
(4)

wherein $R_{41}$ represents alkyl, substituted or unsubstituted phenyl, or substituted or unsubstituted styryl, $R_{42}$ represents substituted or unsubstituted arylene, $R_{43}$ represents substituted or unsubstituted aryl, and $A^\ominus$ represents an anionic residue; and

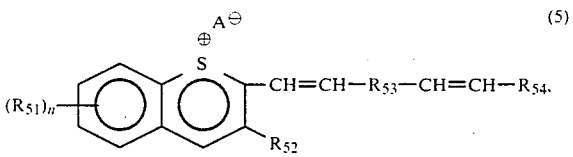
(5)

wherein $R_{51}$ represents alkoxy, $R_{52}$ represents alkyl, $R_{53}$ represents substituted or unsubstituted arylene, $R_{54}$ represents substituted or unsubstituted aryl, $A^\ominus$ represents an anionic residue, and n represents an integer of 1 or 2.

2. The electrophotographic photosensitive member of claim 1, wherein said compound is a polymethine compound of the following formula

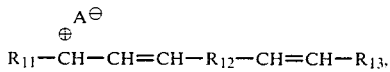
(1)

wherein $R_{11}$ and $R_{13}$ each denote substituted or unsubstituted aryl, $R_{12}$ denotes substituted or unsubstituted arylene, and $A^\ominus$ is an anionic residue.

3. The electrophotographic photosensitive member of claim 1, wherein said compound is a polymethine compound of the following formula

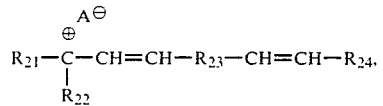
(2)

wherein $R_{21}$, $R_{22}$, and $R_{24}$ each denote substituted or unsubstituted aryl, $R_{23}$ denotes substituted or unsubstituted arylene, and $A^\ominus$ is an anionic residue.

4. The electrophotographic photosensitive member of claim 1, wherein said compound is a polymethine compound of the following formula wherein $R_{31}$, $R_{33}$, and $R_{35}$ each denote substituted or unsubstituted aryl, $R_{32}$ and $R_{34}$ each denote substituted or unsubstituted arylene, and $A^\ominus$ is an anionic residue.

5. The electrophotographic photosensitive member of claim 1, wherein said compound is a naphthothiapyrylium compound of the following formula

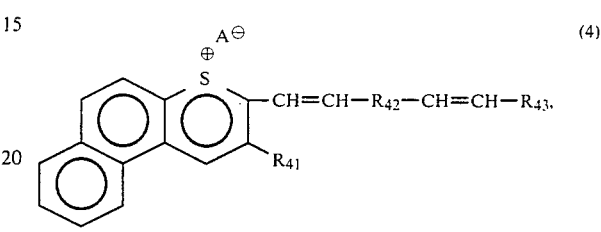
(4)

wherein $R_{41}$ is alkyl, substituted or unsubstituted phenyl, or substituted or unsubstituted styryl, $R_{42}$ denotes substituted or unsubstituted arylene, $R_{43}$ denotes substituted or unsubstituted aryl, and $A^\ominus$ is an anionic residue.

6. The electrophotographic photosensitive member of claim 1, wherein said compound is a benzothiapyrylium compound of the following formula

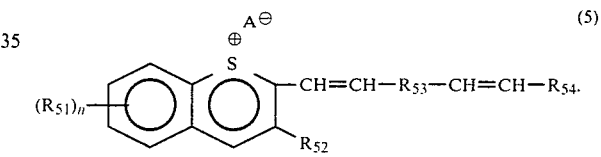
(5)

wherein $R_{51}$ is alkoxy, $R_{52}$ is alkyl; $R_{53}$ denotes substituted or unsubstituted arylene, $R_{54}$ denotes substituted or unsubstituted aryl, $A^\ominus$ is an anionic residue, and n is an integer of 1 or 2.

7. The electrophotographic photosensitive member of claim 1, wherein said photosensitive layer contains another photoconductive substance besides the compound of the formulae (1)–(5).

8. The electrophotographic photosensitive member of claim 7, wherein said photoconductive substance is an organic photoconductive substance.

9. The electrophotographic photosensitive member of claim 8, wherein said organic photoconductive substance is at least one compound selected from the group consisting of hydrazones, pyrazoline compounds, oxazole compounds, thiazole compounds, triarylmethanes, polyarylalkanes, triphenylamine, and poly(N-vinyl-carbazole).

10. The electrophotographic photosensitive member of claim 9, wherein said organic photoconductive substance is a hydrazone.

11. The electrophotographic photosensitive member of claim 7, wherein said photoconductive substance is an inorganic photoconductive substance.

12. The electrophotographic photosensitive member of claim 11, wherein said inorganic photoconductive substance is at least one compound selected from the group consisting of zinc oxide, cadmium sulfide, and selenium.

13. The electrophotographic photosensitive member of claim 1, wherein an undercoating layer is laid between said conductive substrate and said photosensitive layer.

14. An electrophotographic photosensitive member having a conductive substrate, charge generation layer, and charge transport layer, said charge generation layer comprising a binder and at least one compound of the following formulae (1)-(5):

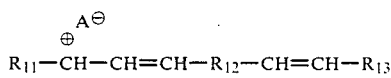
(1)

wherein $R_{11}$ and $R_{13}$ each represent substituted or unsubstituted aryl, $R_{12}$ represents substituted or unsubstituted arylene, and $A^\ominus$ represents an anionic residue;

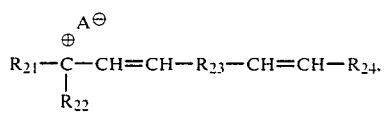
(2)

wherein $R_{21}$, $R_{22}$, and $R_{24}$ each represent substituted or unsubstituted aryl, $R_{23}$ represents substituted or unsubstituted arylene, and $A^\ominus$ represents an anionic residue;

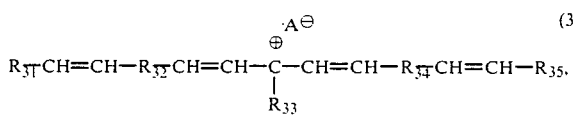
(3)

wherein $R_{31}$, $R_{33}$, and $R_{35}$ each represent substituted or unsubstituted aryl, $R_{32}$ and $R_{34}$ each represent substituted or unsubstituted arylene, and $A^\ominus$ represents an anionic residue;

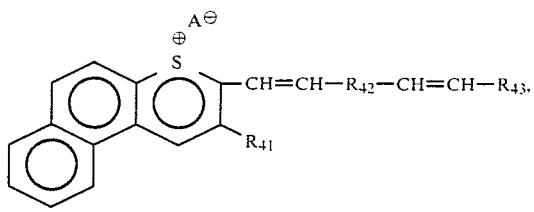
(4)

wherein $R_{41}$ represents alkyl, substituted or unsubstituted phenyl, or substituted or unsubstituted styryl, $R_{42}$ represents substituted or unsubstituted arylene, $R_{43}$ represents substituted or unsubstituted aryl, and $A^\ominus$ represents an anionic residue; and

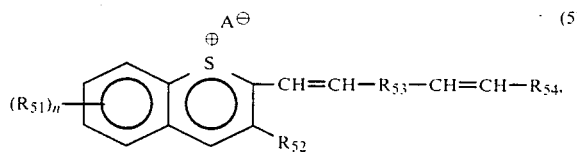
(5)

wherein $R_{51}$ represents alkoxy, $R_{52}$ represents alkyl, $R_{53}$ represents substituted or unsubstituted arylene, $R_{54}$ represents substituted or unsubstituted aryl, $A^\ominus$ represents an anionic residue, and n represents an integer of 1 or 2.

15. The electrophotographic photosensitive member of claim 14, wherein said compound is a polymethine compound of the following formula

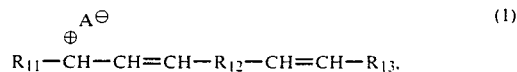
(1)

wherein $R_{11}$ and $R_{13}$ each denote substituted or unsubstituted aryl, $R_{12}$ denotes substituted or unsubstituted arylene, and $A^\ominus$ is an anionic residue.

16. The electrophotographic photosensitive member of claim 14, wherein said compound is a polymethine compound of the following formula

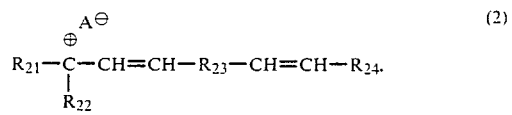
(2)

wherein $R_{21}$, $R_{22}$, and $R_{24}$ each denote substituted or unsubstituted aryl, $R_{23}$ denotes substituted or unsubstituted arylene, and $A^\ominus$ is an anionic residue.

17. The electrophotographic photosensitive member of claim 14, wherein said compound is a polymethine compound of the following formula

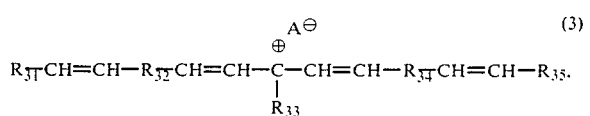
(3)

wherein, $R_{31}$, $R_{33}$, and $R_{35}$ each denote substituted or unsubstituted aryl, $R_{32}$ and $R_{34}$ each denotes substituted or unsubstituted arylene, and $A^\ominus$ is an anionic residue.

18. The electrophotographic photosensitive member of claim 14, wherein said compound is a naphthothiapyrylium compound of the following formula

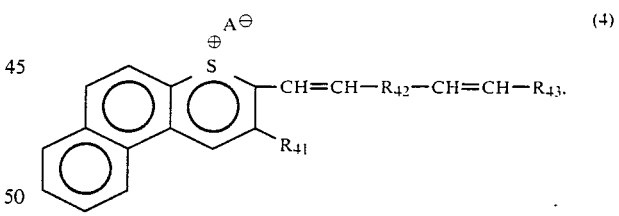
(4)

wherein $R_{41}$ is alkyl, substituted or unsubstituted phenyl, or substituted or unsubstituted styryl, $R_{42}$ denotes substituted or unsubstituted arylene, $R_{43}$ denotes substituted or unsubstituted aryl, and $A^\ominus$ is an anionic residue.

19. The electrophotographic photosensitive member of claim 14, wherein said compound is a benzothiapyrylium compound of the following formula

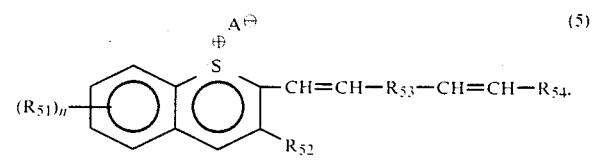
(5)

wherein $R_{51}$ is alkoxy, $R_{52}$ is alkyl, $R_{53}$ denotes substituted or unsubstituted arylene, $R_{54}$ denotes substituted or unsubstituted aryl, $A^\ominus$ is an anionic residue; and n is an integer of 1 or 2.

20. The electrophotographic photosensitive member of claim 14, wherein the charge transport layer is laid on the upper side of the charge generation layer.

21. The electrophotographic photosensitive member of claim 20, wherein an undercoating layer is laid between the conductive substrate and the charge generation layer.

22. The electrophotographic photosensitive member of claim 14, wherein the compound of the formulae (1)-(5) in the charge generation layer is dispersed in the binder.

23. The electrophotographic photosensitive member of claim 22, wherein the charge generation layer has a thickness of 0.01-10μ.

24. The electrophotographic photosensitive member of claim 23, wherein the charge generation layer has a thickness of 0.05-2μ.

25. The electrophotographic photosensitive member of claim 14, wherein the charge transport layer comprises a charge-transporting material and a binder.

26. The electrophotographic photosensitive member of claim 25, wherein the charge transporting material is a hole-transporting material.

27. The electrophotographic photosensitive member of claim 26, wherein the hole-transporting material is at least one compound selected from the group consisting of hydrazones, pyrazoline compounds, oxazole compounds, thiazole compounds, triarylmethanes, polyarylalkanes, organic photoconductive polymers, pyrene, and carbazole derivatives.

28. The electrophotographic photosensitive member of claim 27, wherein the hole-transporting material is a hydrazone.

29. The electrophotographic photosensitive member of claim 27, wherein the hole-transporting material is a pyrazoline derivative.

30. The electrophotographic photosensitive member of claim 25, wherein the charge-transporting material is an electron-transporting material.

31. The electrophotographic photosensitive member of claim 30, wherein the electron-transporting material is at least one compound selected from the group consisting of chloranil, bromanil, tetracyanoethylene, tetracyanoquinodimethane, polynitrofluoroenones, and polynitroxanthones.

32. An electrophotographic process comprising the steps of
(I) charging to the surface of a photosensitive member which is formed on a conductive substrate and has a charge generation layer and a charge transport layer, said charge generation layer comprising a binder and at aleast one compound of the following formulae (1)-(5);

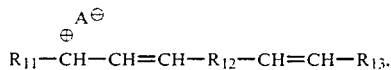
(1)

wherein $R_{11}$ and $R_{13}$ each represent substituted or unsubstituted aryl, $R_{12}$ represents substituted or unsubstituted arylene, and $A^\ominus$ represents an anionic residue;

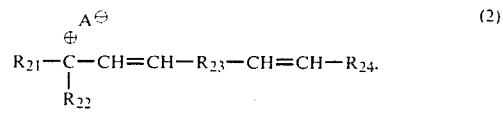
(2)

wherein $R_{21}$, $R_{22}$, and $R_{24}$ each represent substituted or unsubstituted aryl, $R_{23}$ represents substituted or unsubstituted arylene, and $A^\ominus$ represents an anionic residue;

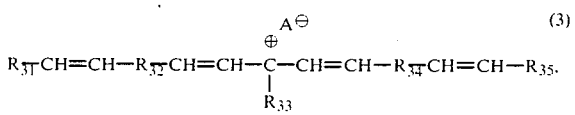
(3)

wherein $R_{31}$, $R_{33}$, and $R_{35}$ each represent substituted or unsubstituted aryl, $R_{32}$ and $R_{34}$ each represent substituted of unsubstituted arylene, and $A^\ominus$ represents an anionic residue;

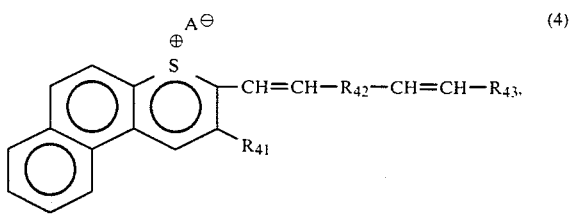
(4)

wherein $R_{41}$ represents alkyl, substituted or unsubstituted phenyl, or substituted or unsubstituted styryl, $R_{42}$ represents substituted or unsubstituted arylene, $R_{43}$ represents substituted or unsubstituted aryl, and $A^\ominus$ represents an anionic residue; and

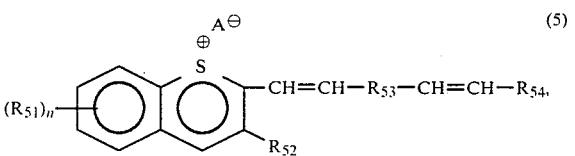
(5)

wherein $R_{51}$ represents alkoxy; $R_{52}$ represents alkyl, $R_{53}$ represents substituted or unsubstituted arylene, $R_{54}$ represents substituted or unsubstituted aryl; $A^\ominus$ represents an anionic residue, and n represents an integer of 1 or 2:
(II) exposing the charged surface to an imaging laser beam:
(III) developing the resulting electrostatic latent images with a toner:
(IV) transferring the toner images onto a recording medium such as transfer paper: and
(V) fixing the transferred toner images to the recording medium.

33. The electrophotographic process of claim 32, wherein said compound is a polymethine compound of the following formula

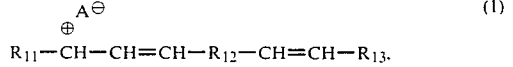
(1)

wherein $R_{11}$ and $R_{13}$ each denote substituted or unsubstituted aryl, $R_{12}$ denotes substituted or unsubstituted arylene, and $A^\ominus$ is an anionic residue.

34. The electrophotographic process of claim 32, wherein said compound is a polymethine compound of the following formula

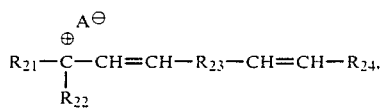 (2)

wherein $R_{21}$, $R_{22}$, and $R_{24}$ each denote substituted or unsubstituted aryl, $R_{23}$ denotes substituted or unsubstituted arylene, and $A^\ominus$ is an anionic residue.

35. The electrophotographic process of claim 32, wherein said compound is a polymethine compound of the following formula

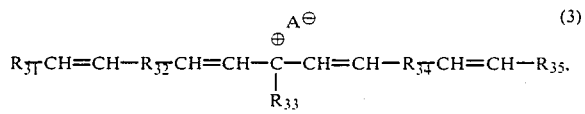 (3)

wherein $R_{31}$, $R_{33}$, and $R_{35}$ each denote substituted or unsubstituted aryl, $R_{32}$ and $R_{34}$ each denotes substituted or unsubstituted arylene, and $A^\ominus$ is an anionic residue.

36. The electrophotographic process of claim 32, wherein said compound is a naphthothiapyrylium compound of the following formula

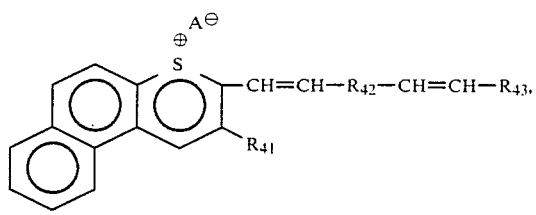 (4)

PS wherein $R_{41}$ is alkyl, substituted or unsubstituted phenyl, or substituted or unsubstituted styryl; $R_{42}$ denotes substituted or unsubstituted arylene, $R_{43}$ denotes substituted or unsubstituted aryl, and $A^\ominus$ is an anionic residue.

37. The electrophotographic process of claim 32, wherein said compound is a benzothiapyrylium compound of the following formula

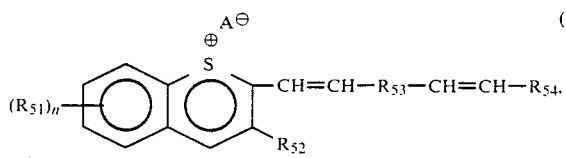 (5)

wherein $R_{51}$ is alkoxy, $R_{52}$ is alkyl, $R_{53}$ denotes substituted or unsubstituted arylene, $R_{54}$ denotes substituted or unsubstituted aryl; $A^\ominus$ is an anionic residue, and n is an integer of 1 or 2.

38. The electrophotographic process of claim 32, wherein the laser used is a semiconductor laser.

39. The electrophotographic process of claim 32, wherein the laser beam has a wavelength of 750 nm or longer.

40. The electrophotographic process of claim 38, wherein the semiconductor laser is a gallium-aluminum-arsenic semiconductor laser.

41. The electrophotographic process of claim 32, wherein the charge transport layer is laid on the upper side of the charge generation layer.

42. An optical recording medium provided with a recording layer on a substrate, said recording layer comprising at least one compound of the following formulae (1)-(5):

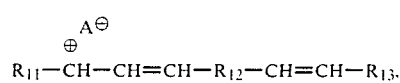 (1)

wherein $R_{11}$ and $R_{13}$ each represent substituted or unsubstituted aryl, $R_{12}$ represents substituted or unsubstituted arylene, and $A^\ominus$ represents an anionic residue;

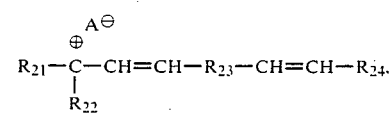 (2)

wherein $R_{21}$, $R_{22}$, and $R_{24}$ each represent substituted or unsubstituted aryl, $R_{23}$ represents substituted or unsubstituted arylene, and $A^\ominus$ represents an anionic residue;

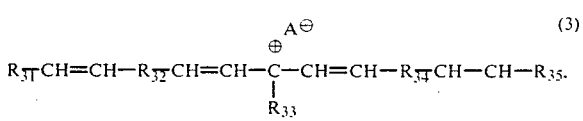 (3)

wherein $R_{31}$, $R_{33}$, and $R_{35}$ each represent substituted or unsubstituted aryl, $R_{32}$ and $R_{34}$ each represent substituted or unsubstituted arylene, and $A^\ominus$ represents an anionic residue;

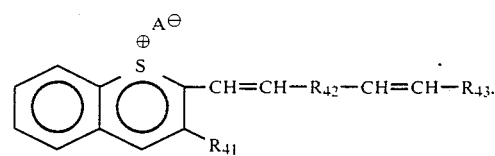 (4)

wherein $R_{41}$ represents alkyl, substituted or unsubstituted phenyl, or substituted or unsubstituted styryl, $R_{42}$ represents substituted or unsubstituted arylene $R_{43}$ represents substituted or unsubstituted aryl; and $A^\ominus$ represents an anionic residue; and

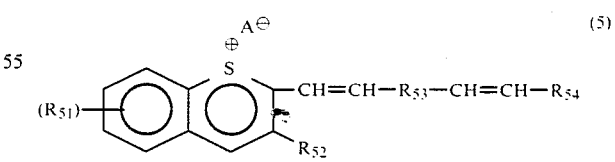 (5)

wherein $R_{51}$ represents alkoxy, $R_{52}$ represents alkyl, $R_{53}$ represents substituted or unsubstituted arylene, $R_{54}$ represents substituted or unsubstituted aryl, $A^\ominus$ represents an anionic residue; and n represents an integer of 1 or 2.

43. The optical recording medium of claim 42, wherein said compound is a polymethine compound of the following formula

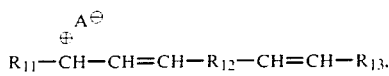

(1)

wherein $R_{11}$ and $R_{13}$ each denote substituted or unsubstituted aryl, $R_{12}$ denotes substituted or unsubstituted arylene, and $A^{\ominus}$ is an anionic residue.

44. The optical recording medium of claim 42, wherein said compound is a polymethine compound of the following formula

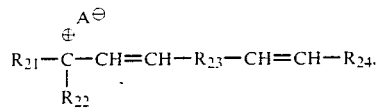

(2)

wherein $R_{21}$, $R_{22}$, and $R_{24}$ each denote substituted or unsubstituted aryl, $R_{23}$ denotes substituted or unsubstituted arylene, and $A^{\ominus}$ is an anionic residue.

45. The optical recording medium of claim 42, wherein said compound is a polymethine compound of the following formula

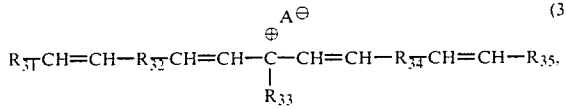

(3)

wherein $R_{31}$, $R_{33}$, and $R_{35}$ each denote substituted or unsubstituted aryl, $R_{32}$ and $R_{34}$ each denote substituted or unsubstituted arylene, and $A^{\ominus}$ is an anionic residue.

46. The optical recording medium of claim 42, wherein said compound is a naphthothiapyrylium compound of the following formula

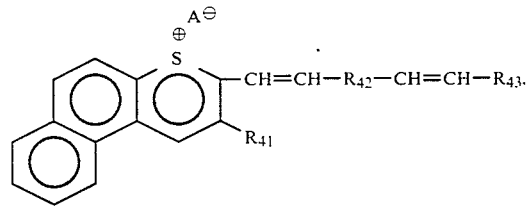

(4)

wherein $R_{41}$ is alkyl, substituted or unsubstituted phenyl, or substituted or unsubstituted styryl, $R_{42}$ denotes substituted or unsubstituted arylene, $R_{43}$ denotes substituted or unsubstituted aryl, and $A^{\ominus}$ is an anionic residue.

47. The optical recording medium of claim 42, wherein said compound is a benzothiapyrylium compound of the following formula

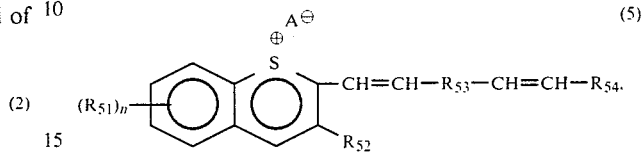

(5)

wherein $R_{51}$ is alkoxy; $R_{52}$ is alkyl, $R_{53}$ denotes substituted or unsubstituted arylene, $R_{54}$ denotes substituted or unsubstituted aryl, $A^{\ominus}$ is an anionic residue, and n is an integer of 1 or 2.

48. The optical recording medium of claim 42, wherein the recording layer comprises a compound of the formulae (1)–(5) and a binder.

49. The optical recording medium of claim 48, wherein the binder is at least one resin selected from the group consisting of cellulose esters, cellulose ethers, vinyl resins, acrylic resins, polyesters, polyacrylates, polyamides, polyimides, epoxy resins, and phenolic resins.

50. The optical recording medium of claim 49, wherein the binder is a cellulose ester.

51. The optical recording medium of claim 50, wherein the cellulose ester is nitrocellulose.

52. The optical recording medium of claim 42, wherein the recording layer has a thickness of 0.01–10μ.

53. The optical recording medium of claim 52, wherein the recording layer has a thickness of 0.05–2μ.

54. The optical recording medium of claim 42, wherein the recording layer is a vapor-deposited film of the compound of the formulae (1)–(5).

55. The optical recording medium of claim 42, wherein the substrate is made of a plastic, glass, or metal.

56. The optical recording medium of claim 42, wherein a reflecting layer is laid between the substrate and the recording layer.

* * * * *

UNITED STATES PATENT AND TRADEMARK OFFICE
CERTIFICATE OF CORRECTION

PATENT NO. : 4,501,808
DATED : February 26, 1985
INVENTOR(S) : KIYOSHI SAKAI ET AL.

Page 1 of 3

It is certified that error appears in the above-identified patent and that said Letters Patent is hereby corrected as shown below:

Title page, under "References Cited" [last entry] "Tano" should be --Tang--

Col. 4, line 2, change "represent" to --represents--

Col. 4, line 12, change "formula;" to --formula,--

Col. 15 and 16, formula "C-(7)"

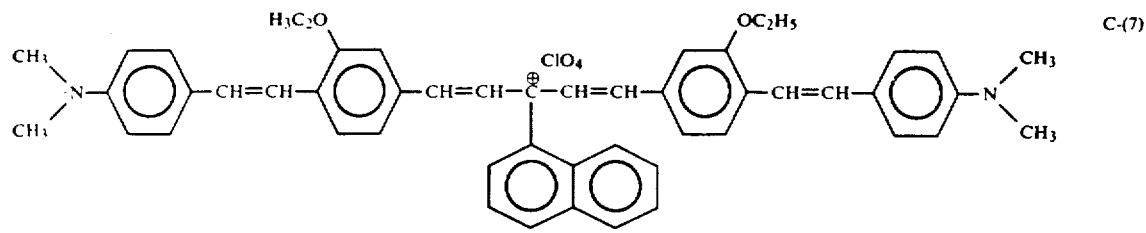

should be --C-(7)--

C-(7)

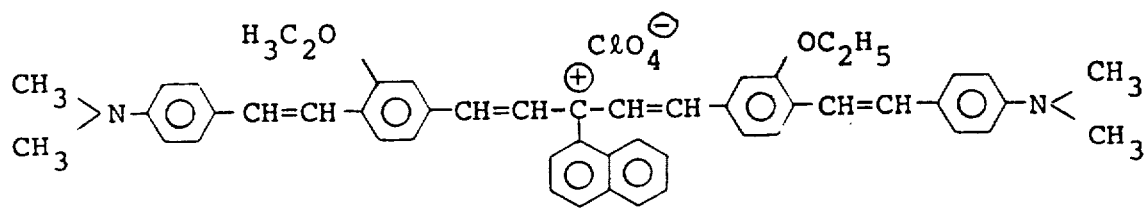

UNITED STATES PATENT AND TRADEMARK OFFICE
CERTIFICATE OF CORRECTION

PATENT NO. : 4,501,808

DATED : February 26, 1985

INVENTOR(S) : KIYOSHI SAKAI, ET AL.

It is certified that error appears in the above-identified patent and that said Letters Patent is hereby corrected as shown below:

Col. 26, line 34, "utraviolet" should be --ultraviolet"

Col. 26, line 35, after "and", delete --for--

Col. 28, line 25, "images" should be --image--

Col. 39, line 40, Delete "PS"

Col. 40, line 30, Claim 42, formula "(3)"

should be --(3)--

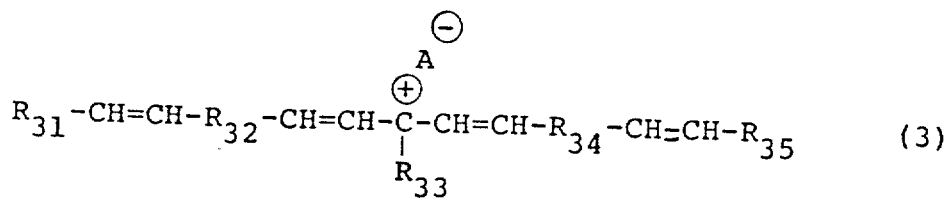

UNITED STATES PATENT AND TRADEMARK OFFICE
CERTIFICATE OF CORRECTION

PATENT NO. : 4,501,808

DATED : February 26, 1985

INVENTOR(S) : KIYOSHI SAKAI, ET AL.

It is certified that error appears in the above-identified patent and that said Letters Patent is hereby corrected as shown below:

Col. 40, line 49, change "arylene $R_{43}$" to --arylene, $R_{43}$--

Col. 40, line 57, formula (5)

"$(R_{51})$" should be --$(R_{51})_n$--

Signed and Sealed this

Twenty-first Day of January 1986

[SEAL]

Attest:

DONALD J. QUIGG

Attesting Officer

Commissioner of Patents and Trademarks